(12) United States Patent
Srinivasan et al.

(10) Patent No.: US 6,294,817 B1
(45) Date of Patent: Sep. 25, 2001

(54) SOURCE/DRAIN-ON INSULATOR (S/DOI) FIELD EFFECT TRANSISTOR USING OXIDIZED AMORPHOUS SILICON AND METHOD OF FABRICATION

(75) Inventors: Senthil Srinivasan, Paris (FR); Bomy Chen, Stormville, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/459,483

(22) Filed: Dec. 13, 1999

(51) Int. Cl.[7] ................................................. H01L 29/72
(52) U.S. Cl. ..................... 257/397; 257/52; 257/347; 257/510; 257/513; 257/514; 257/515; 438/221; 438/296; 438/297
(58) Field of Search ................................ 257/347, 397, 257/510, 513, 514, 515, 52; 438/221, 296, 297

(56) References Cited

U.S. PATENT DOCUMENTS 5,949,116 * 9/1999 Wen ...................................... 257/397

* cited by examiner

Primary Examiner—Edward Wojciechowicz
(74) Attorney, Agent, or Firm—Stanton C. Braden

(57) ABSTRACT

Source and drain regions of field effect transistors are fabricated with an electrically insulating layer formed thereunder so as to reduce junction capacitance between each and a semiconductor body in which the regions are formed. Shallow trench isolation partially surrounds each transistor so as to further electrically isolate the source and drain regions from the semiconductor body. Typically for a single transistor only one surface of each drain and source region make direct contact to the semiconductor body and these surfaces are on opposite sides of a channel region of each transistor. One method of fabrication of the source and drain regions is to form an isolating isolation region around active areas in which a transistor is to be formed in a semiconductor body. Trenches separated by portions of the body are then formed in the active areas in which transistors are to be formed. On bottom surfaces of the trenches are formed an electrically insulating layer. The trenches are then filled with semiconductor material of a conductivity type opposite that of the semiconductor body. The semiconductor filled portion of each trench then serves as a drain and/or source of a field effect transistor.

16 Claims, 16 Drawing Sheets

SOURCE/DRAIN-ON INSULATOR (S/DOI) FIELD EFFECT TRANSISTOR USING OXIDIZED AMORPHOUS SILICON AND METHOD OF FABRICATION

CROSS REFERENCE TO RELATED APPLICATIONS

This application is related to application Ser. No. 09/459,484, which is entitled "SOURCE/DRAIN-ON-INSULATOR (S/DOI) FIELD EFFECT TRANSISTOR USING SILICON NITRIDE AND SILICON OXIDE AND METHOD OF FABRICATION", and is being filed concurrently with the present application and in which there is a common inventorship and assignee.

FIELD OF THE INVENTION

This invention relates to integrated circuits manufactured using a Silicon-On-Insulator (SOI) like technology, and more particularly, to field effect transistors in which the sources and drains are partially electrically insulated from the semiconductor body in which same are formed.

BACKGROUND OF THE INVENTION

Integrated circuits composed of Metal-Oxide-Semiconductor Field Effect Transistors (MOSFETs) have become the workhorse of the semiconductor industry. These integrated circuits contain from two to several million MOSFETs fabricated on a common semiconductor body. An individual MOSFET comprises a pair of regions of one conductivity type which have been formed in a semiconductor body and which are spaced apart by an intermediate portion of the semiconductor body which is of the opposite semiconductor type. Current flow between electrodes attached to these two spaced apart regions is controlled by an electrode (gate) positioned at a top surface adjacent the intermediate region which is electrically insulated therefrom by a thin layer of silicon dioxide that is formed by oxidizing a surface layer of the intermediate region. In operation, a voltage applied to the gate of sufficient magnitude and polarity to invert the conductivity type of the intermediate region gives rise to a conductive channel between the two spaced regions in which current flows when a suitable voltage is established by electrode connections to the two spaced apart regions. The two spaced apart regions are usually identified as the source and drain of the field effect transistor. The intermediate region between the source and drain is usually identified as the channel region.

It is well known that unless suitable precautions are taken, unwanted, parasitic current can, and will, flow between various elements of the integrated circuit. Parasitic current can flow between the source and drain region. It may not be controlled by the gate potential. Parasitic current can also flow between the source and drain regions of adjacent but separate transistors, and again is not controlled by the potential applied to the gates of the various transistors.

If the integrated circuit is of the type known as a Complementary Metal-Oxide-Semiconductor (CMOS) integrated circuit, these parasitic currents can give rise to a phenomenon known as "Latchup", a condition in which a very large, potentially destructive parasitic current can flow between the most positive and most negative power supply terminals of the integrated circuit. In a CMOS integrated circuit, two types of transistors are formed, each having opposite conductivity type in the intermediate region between the source and drain regions of the two types of transistor. Transistors of one type are formed directly in the semiconductor body, and transistors of the other type are formed in a region known as a "well", which is of conductivity type opposite that of the semiconductor body, and which has been diffused into the semiconductor body.

Various methods are in common use to reduce the magnitude of, or in some cases completely suppress, the various parasitic currents which can flow in an integrated circuit. One such method is to diffuse into the surface region of the semiconductor body, exterior to the source, drain and channel regions, impurities which increase the impurity concentration of the exterior regions such that the conductivity type of same can not be easily inverted. Such a diffusion is known as a "channel stopper" or "chanstop" diffusion. In these regions, the potential required to invert the conductivity type of the surface of the semiconductor body is greater than such potential in the channel region of the transistor, and is usually designed to be greater than the maximum potential applied to the integrated circuit.

Another method of reducing or suppressing the various parasitic currents is to form in the region exterior to the channel region an oxide whose thickness is greater than the thickness of the oxide formed under the gate electrode in the intermediate or channel region of the transistor. Again, in these regions, the potential at the top surface of the thicker oxide required to invert the surface of the semiconductor body will be greater than such potential in the channel region of the transistor, and is usually designed to be greater than the maximum potential applied to the integrated circuit.

Often, these two methods are combined in the effort to reduce or suppress the parasitic currents. Other methods which have been applied include the use of trenches filled with insulating material which are fabricated so as to completely surround and isolate each transistor, and the use of a field-shield, which is a conducting electrode formed over the region exterior to the source, drain channel region of the transistor, and which is connected to the lowest power supply potential applied to the integrated circuit. Such methods of reducing or suppressing the parasitic currents are further discussed in textbooks such as "Silicon Processing for the VLSI Era, Volume II, page 66, S. Wolf".

All of the above methods incur some expense or limitations, including increased manufacturing cost, increased processing complexity, and reduced or impaired circuit performance.

A device which limits parasitic current which is of a completely different nature than those described above is the Silicon-On-Insulator (SOI) device. In this device, the end result is that each individual transistor is completely encased in a protective insulating material which completely surrounds the transistor, thus preventing any parasitic current flow between adjacent transistors through a common substrate. An additional benefit of the SOI structure is the reduced capacitance between the source or drain and the semiconductor body which results in improved performance of the transistor.

In one form of SOI, semiconductor films are deposited on an insulating substrate, islands of semiconductor film are defined, and the semiconductor film is completely removed from the region between the islands. This region is subsequently filled with an insulating material, and individual transistors are formed in the islands. Small sub-circuits consisting of a small number of transistors can also be formed in a given island of semiconductor material.

In another form of SOI, the starting material is a silicon semiconductor body on the surface of which isolated islands of silicon are formed by oxidizing the silicon surrounding and underneath the islands. This latter method is preferred in many cases because the starting material is semiconductor substrates which are of the same type as are being used for the manufacture of other types of integrated circuit, and also because the semiconductor properties of the resulting islands are superior to that of semiconductor islands formed in a film of semiconductor material formed on the surface of an insulating substrate.

One weakness of these SOI techniques is that the islands of semiconductor material are not connected to a reference potential of the power supply, such as either ground or the highest potential supplied by the power source. In the conventional methods of forming an integrated circuit, the semiconductor body, and in the case of CMOS integrated circuits, the "well" also, is connected to one of the power supply terminals. In previously describe forms of SOI, the semiconductor islands are not connected directly to a reference potential, but are left unconnected, or "floating". This leads to an effect known as the "floating body effect" (FBE). The deleterious effect of FBE on the performance of SOI integrated circuits is well known, and has been described for example, in the article "Floating-Body Effects in Partially Depleted SOI CMOS Circuits, Lu et al., IEEE Journal of Solid State Circuits, Vol. 32, No. 8, August 1997". The effects of the FBE on circuit performance include extra power consumption, degraded noise margin and stability of the circuits, and, in certain dynamic circuits, logic state errors. These effects arise in part because of capacitive coupling between the semiconductor island and adjacent signal carrying conductor lines. The effect of the FBE on individual transistor characteristics include degraded breakdown voltage, a lowering of the threshold voltage at high drain potential, and hysteresis and instability during dynamic operation.

Prior art solutions to this problem have included the introduction of additional layers of interconnection which allow the connection of each individual semiconductor island to an appropriate reference potential. This requires an increase in the size of the integrated circuit because of the area which must be devoted to the connection of each individual semiconductor island to the interconnection layer, and also can require an increase in the number of process steps required to fabricate the integrated circuit. Both of these lead to higher manufacturing cost, and the increase in size can lead to lower performance of the integrated circuit.

In another prior art solution to the problems caused by the Floating-Body Effect, the starting material is a silicon semiconductor body into which oxygen ions are deeply implanted. The silicon semiconductor body is then annealed at a sufficiently high temperature so that the implanted oxygen atoms interact with the silicon semiconductor body to form a layer of insulating silicon dioxide buried beneath a surface layer of semiconducting silicon. In one type of prior art SOI technology, islands of silicon can then be formed in this semiconductor body by masking the region where islands are to be formed with a suitable material such as silicon nitride, and then oxidizing the surface of the semiconductor body to form regions of silicon dioxide which extend from the surface down to meet the buried layer of silicon dioxide which was formed previously. This results in the formation of completely isolated islands of silicon.

A further variation of this technology is to control the final oxidation such that the oxidized regions extending down from the surface do not meet the underlying buried oxide layer, but leave a thin film of silicon connecting the bottoms of all the silicon islands. This form of SOI is referred to as Body-Contacted Silicon-On-Insulator (BC-SOI) and is described in an article entitled "1 Giga Bit SOI DRAM with Fully Bulk Compatible Process and Body-Contacted SOI MOSFET Structure", by Koh et al., Digest of Technical Papers, International Electron Device Meeting, 1997.

It is desirable to provide a method of fabricating Source/Drain-On-Insulator (S/DOI) devices which provides the advantages of SOI devices, while providing the ability to selectively incorporate this benefit into parts of the circuit, leaving other parts of the circuit using standard, conventional devices, thereby enhancing the performance of the circuitry, and which method can be incorporated into the existing CMOS and/or Bipolar process flow using the existing, conventional tool set. Further, since the insulator material is only beneath the sources and drains of the transistors, the method should provide a means of limiting, or eliminating, the Floating-Body Effect (FBE) in the SOI devices.

SUMMARY OF THE INVENTION

We have found that the benefits of Silicon-on-Insulator (SOI) devices can be provided without the accompanying drawbacks of conventional SOI devices by fabricating the Source/Drain-On-Insulator (S/DOI) devices described in this invention using the methods of fabrication described herein. Further, the method of fabrication allows the fabrication of both S/DOI and conventional CMOS or Bipolar devices in the same circuit, using the existing tool set which is used to fabricate the conventional devices, and with only minor changes and interruptions to the conventional process flow.

The Source/Drain-On Insulator process will be described in the context of adding the S/DOI process to a conventional CMOS process used to convert a simple, virgin semiconductor body into an operating CMOS Integrated Circuit. The conventional process sequence and flow is followed up through the process of the formation of the polysilicon gates and conductors, and the ion implantation of the Lightly Doped Drain (LDD) extensions (not shown) for n-channel and p-channel field effect transistors. The region of the semiconductor body outside that where the transistors are to be formed comprises thick semiconductor oxide which is denoted as Shallow Trench Isolation (STI) oxide. The region of the semiconductor body where transistors are to be formed will have a silicon surface. A silicon nitride hard mask, used to define the polysilicon, is left in place on the top surface of the polysilicon. A standard wet clean is done to remove the etch residue following the polysilicon etch. The sidewalls of the polysilicon is oxidized, suitable masking is applied, and a dopant is implanted to form a lightly doped drain (LDD) extension (not shown) for the n-channel transistors. Additional oxide may be deposited to cover the sidewalls of the polysilicon gates, followed by additional masking and a LDD implant (nor shown) for the p-channel transistors. A final oxide is then deposited on the sidewalls of the polysilicon gates. These oxide depositions and LDD implants are normally a part of a conventional process for forming Metal Oxide Semiconductor Field Effect Transistors (MOSFETs). The first step in the new S/DOI process is to deposit a blocking layer of silicon nitride, with a thickness of approximately 20 nm. Conventional lithography processes are then used to define and protect the regions of the circuit where conventional devices will later be formed, and the silicon nitride is selectively etched from the regions of the circuit where the S/DOI devices will be formed. Next, a selective etch process which is selective to etching silicon, and does not etch silicon nitride or oxide, is then used to etch the exposed silicon, exterior to the gates of the S/DOI transistors being fabricated, to a depth of approximately 300 nm. The surface of the semiconductor body is then covered with a layer of deposited, undoped, amorphous silicon. This deposited silicon fills the previously etched region adjacent to the gates of the S/DOI transistors being fabricated. This amorphous silicon is then etched to leave approximately 30 nm of silicon in the region adjacent to the gates of the S/DOI transistors being fabricated. An etch which is selective to etching silicon, and does not etch silicon nitride or oxide is used. A layer of silicon nitride, approximately 5 nm thick, is then formed on the surface of the semiconductor body and the vertical sidewalls of the polysilicon gates, using a Rapid Thermal Nitridation process. An anisotropic etch is then used to remove the 5 nm of silicon nitride from the lateral surfaces of the semiconductor body, leaving the silicon nitride on the sidewalls of the polysilicon gates and on the sidewalls of the silicon remaining underneath the gates. A Rapid Thermal Oxidation (RTO) process is then used to convert the remaining 30 nm of amorphous silicon to a layer of silicon oxide, which will be 50 to 80 nm thick. The 5 nm of RTN nitride protects the polysilicon gates and the silicon underneath the gates from being oxidized in this process. An isotropic wet etch is then used to remove the remaining 5 nm of RTN nitride, leaving approximately 15 nm of the previously deposited blocking nitride. A layer of intrinsic, undoped amorphous silicon is then again deposited on the surface of the semiconductor body. The amorphous silicon is then etched to a level at or just below the level of the STI oxide. An etch which is selective to etching silicon, and does not etch silicon nitride or oxide is used. An isotropic etch is then used to completely remove the remaining silicon nitride, both the blocking layer and the hard mask used to pattern the polysilicon. This etch must be selective to etching silicon nitride, and not etching silicon and silicon oxide. The source and drain (or collector/emitter in the case of Bipolar transistors) implantations and activations are then performed. The conventional processing which would be performed after source/drain formation then proceeds according to the conventional process sequence.

Viewed from a first apparatus aspect, the present invention is directed to a semiconductor structure comprising a semiconductor body having a surface and being of a first conductivity type, a gate region being separated from the surface by a gate dielectric layer, and first and second semiconductor regions. The first and second semiconductor regions are located in portions of the semiconductor body, are separated from each other by a portion of the body located under the gate region, and are of a second conductivity type which is opposite the first conductivity type. The first and second semiconductor regions and the gate region serve as first and second outputs and a gate, respectively, of an insulated gate field effect transistor. The first and second semiconductor regions are electrically isolated from the body by a dielectric region and by a dielectric layer except for a surface of each which is located below the gate region and is in electrical contact with the body.

Viewed from a second apparatus aspect, the present invention is directed to a semiconductor structure comprising a crystalline semiconductor body of a first conductivity type, a polysilicon gate separated from an underlying region of the body by a gate dielectric layer of silicon oxide and source and drain regions of amorphous semiconductor which are of the opposite conductivity type of the body, are in contact with the body, and are separated by a portion of the body. The source and drain regions are electrically isolated from the semiconductor body except a surface of each which is located below the polysilicon gate and is in electrical contact with the bulk portion of the semiconductor body.

Viewed from a third apparatus aspect, the present invention is directed to a semiconductor body having a major surface and having a bulk portion of a first conductivity type with active areas of the body being surrounded by an insulating isolation region which extends from the major surface of the body into the bulk portion of the body. At least one of the active areas of the body containing a field effect transistor having a drain region and a source region with both regions being of the opposite conductivity type of the first conductivity region. Each drain and source region has four side walls and a bottom surface with three of the side walls being in contact with portions of the insulating isolation region and the fourth side wall being in contact with a portion of the bulk of the body and being separated from the fourth side wall of an adjacent region by portions of the bulk of the body. An insulating layer separates the bottom of each drain and source region from the bulk of the body.

Viewed from a first process aspect, the present invention is directed to a method of forming drain and source regions of field effect transistors with the drain and source regions being partially electrically isolated from a semiconductor body of a first conductivity in which the transistors are formed. The method comprises the steps of: forming dielectric regions from the surface of the body into the body so as to define therebetween areas of the surface of the body in which transistors are to be formed; etching separated trenches in portions of areas of the surface of the body in which transistors are to be formed; forming an electrically insulating layer at the bottom of each trench; filling each trench with semiconductor material; and doping the fill semiconductor material to be of the opposite conductivity type of the first conductivity type.

Viewed from a second process aspect, the present invention is directed to a method of fabricating field effect transistors each having a drain region and a source region in a semiconductor body having a major surface and having a bulk of a first conductivity type. The method comprises the steps of: patterning the body to define active areas in which transistors are to be formed; forming an insulating isolation region extending from the major surface of the body into the body to surround areas of the wafer in which transistors are to be formed; etching two trenches in at least one of the active areas with the trenches being separated by portions of the bulk of the body and with each trench having three side walls defined by portions of the insulating isolation region and having a fourth side wall and a bottom surface defined by the bulk of the body; covering the bottom surface of each trench with an insulating isolation cover layer; filling the trenches with a semiconductive material; and doping the fill semiconductive material to be of the opposite conductivity type of the bulk portion of the body such that the filled trenches become the drain and source regions of the transistor with the fourth wall side of each pair of drain and source regions being in contact with the bulk of the body and facing each other.

Viewed from a third process aspect, the present invention is directed to a method of fabricating pairs of field effect transistors each having a separate first output region and sharing a common second output region in a semiconductor body having a major surface and having a bulk of a first conductivity type. The method comprises the steps of: patterning the body to define active areas in which transistors are to be formed; forming an insulating isolation region extending from the major surface of the body into the body to surround areas in which transistors are to be formed; etching first, second, and third trenches in at least one of the active areas with the trenches being separated by portions of the bulk of the body and with each trench having first and second two side walls defined by portions of the insulating isolation region and having a third side wall and a bottom surface defined by the bulk portion of the body, the first and third trenches each having a fourth side wall defined by portions of the insulating isolation region, and the second trench having a fourth side wall defined by the bulk portion of the body; covering the bottom of each trench with an insulating isolation layer; filling the trenches with a semiconductive material; and doping the fill semiconductive material to be of the opposite conductivity type of the bulk portion of the body such that the filled first and third trenches become the first output region of each of the first and second transistors, respectively, and the filled second trench becomes the common second output region of both transistors with the third and fourth side walls of the second output region being in contact with the bulk of the body and with each facing the third side wall of a separate first output region.

Viewed from a fourth process aspect, the present invention is directed to a method of forming in a semiconductor body having a major surface and being of a first conductivity type a plurality of insulated gate field effect transistors each having a gate, a drain region, and a source region. The method comprises the steps of: forming dielectric regions from the major surface of the body into the body so as to define active areas of the surface of the body in which transistors are to be formed; forming in the active areas gates which are separated from the surface of the body by a gate dielectric layer; etching exposed portions of the surface adjacent the gates to form a trench on each side of each gate region; forming in bottoms of the trenches a layer of dielectric material and depositing semiconductive material in the trenches to fill the trenches such that each trench filled with semiconductive material forms one of a group consisting of a drain region and a source region having a plurality of surfaces with one surface of each region being in electrical contact with the semiconductor body and with all other surfaces of the drain and source regions being dielectrically isolated from the semiconductor body.

The invention may be more fully understood from the following detailed description, drawings, and claims.

DETAILED DESCRIPTION

Figure 1:
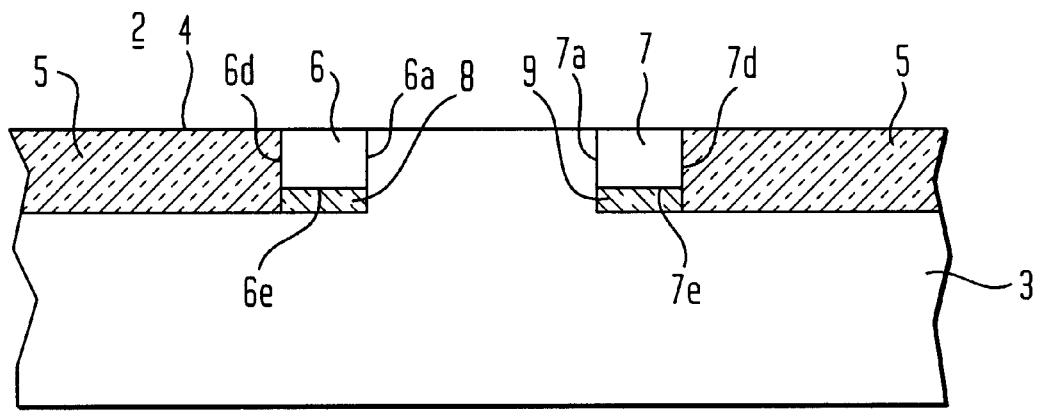
FIGS. 1 and 2 show a cross-sectional and a top view view, respectively, of part of a semiconductor structure in accordance with the present invention.
Figure 2:
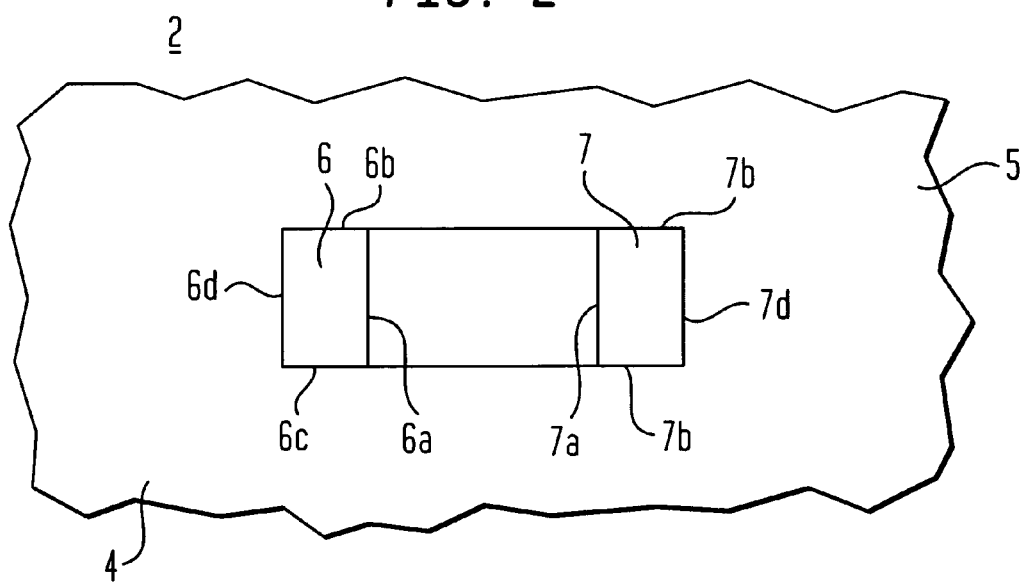

Referring now to FIGS. 1 and 2, there are shown a cross-sectional view and a top view, respectively, of a semiconductor structure 2 comprising a semiconductor body 3 having formed therein a drain region 6 and a source region 7 of a field effect transistor in accordance with the present invention. The semiconductor body 3 has a major surface 4 and is of a first conductivity type. A shallow trench isolation region 5, typically of silicon oxide, extends from surface 4 into the body 3 so as to electrically isolate portions of the body 3 in which transistors and/or other components are to be formed. Trench isolation region 5 may be denoted as a dielectric isolation region. For simplicity, only one isolated portion of the body 3 containing a drain region 6 and a source region 7 of a field effect transistor are shown. Drain region 6 and source region 7 are of a conductivity type which is opposite that of the first conductivity type. For example, body 3 can be of p-type conductivity and drain region 6 and source region 7 are of n-type conductivity. This combination of conductivity types results in an n-channel field effect transistor being formed. Body 3 can be of n-type conductivity and drain region 6 and source region 7 are of p-type conductivity. This combination of conductivity types results in a p-channel field effect transistor being formed.

The source and drain regions of a field effect transistor reverse as the current therethrough reverses and may be denoted as first and second output regions or first and second semiconductor regions. The field effect transistor can be an insulated gate field effect transistor (IGFET) or a junction field effect transistor (JFET). Under the drain region 6 is a dielectric layer 8, typically of silicon oxide, and under the source region 7 is a dielectric layer 9, typically of silicon oxide. Dielectric layers 8 and 9 restrict the flow of parasitic current from the source and drain regions 7 and 6 into the semiconductor body 3 and also can significantly reduce the capacitance of the source region 7 and drain region 6 to the semiconductor body 3.

Drain region 6 has side walls 6a, 6b, 6c, and 6d and a bottom surface 6e. Source region 7 has side walls 7a, 7b, 7c, and 7d and a bottom surface 7e. Side wall 6a of drain region 6 and side wall 7a of source region 7 each make direct contact with bulk portion 3 and the portion of body 3 therebetween becomes the channel region of the field effect transistor. Side walls 6b, 6c, and 6d, and bottom surface 6e of drain region 6 are electrically isolated from body 3 by shallow trench region 5 and dielectric layer 8. Side walls 7b, 7c, and 7d, and bottom surface 6e of source region 7 are electrically isolated from body 3 by shallow trench region 5 and dielectric layer 9.

As a result of isolating regions 5 and 8, the junction capacitance of drain region 6 to the body 3 is reduced from that of a conventional field effect transistor. As a result of isolating regions 5 and 9, the junction capacitance of source region 7 to the body 3 is reduced from that of a conventional field effect transistor.

The drain region 6 and the source region of FIGS. 1 and 2 can be fabricated as follows:

The major surface 4 of the semiconductor body 3 is patterned to define areas thereon in which transistors are to be formed. An insulating isolation region 5 extending from the major surface 4 of the semiconductor body 3 into the body 3 is formed to surround areas of the body 3 in which transistors are to be formed. These surrounded areas are denoted as active areas. Two trenches are etched into at least one active area with the trenches being separated by portions of the body 3. Each trench has three side walls defined by portions of the insulating isolation region 5 and has a fourth side wall and a bottom surface defined by the body 3. The bottom surfaces of the trenches are covered by an insulating layer, typically, silicon oxide. The trenches are then filled with a semiconductive material which is then doped to be of the opposite conductivity of the body 3 such that the filled trenches become the drain and source regions 6 and 7, respectively, of the transistor. The fourth side walls 6a and 7a are each in direct contact with the bulk portion 3, face each other, and are separated by portions of the body 3.

Figure 3:
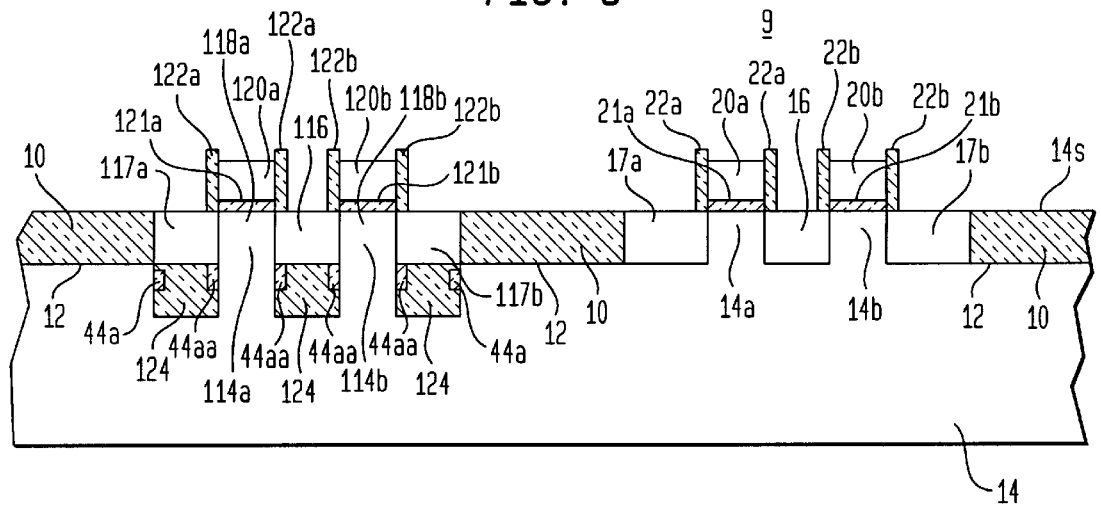
FIG. 3 shows a semiconductor structure in accordance with the first illustrative example of the present invention.

Referring now to FIG. 3, there is shown a sectional view of a semiconductor structure 9 comprising partially completed Source/Drain-On-Insulator (S/DOI) field effect transistors and conventional field effect transistors fabricated in a common semiconductor body 14 in accordance with a first illustrative embodiment of the present invention. Semiconductor body 14, which is of a first conductivity type, is typically silicon. Two S/DOI transistors are shown on the left, and two conventional transistors are shown on the right. A Shallow Trench Isolation (STI) 10 (also denoted as an insulating isolation region) surrounds the two groups of transistors. STI 10 is typically silicon oxide. With respect to the conventional transistors, a semiconductor region 16, which is of the opposite conductivity type of body 14, serves as a common source/drain region for the two conventional transistors and is formed in body 14. Regions 17a and 17b, which are also of the opposite conductivity type, serve as drain/source regions of the left and right conventional transistors, respectively, and are formed in body 14. Portions 14a and 14b of body 14 are channel regions, regions 20a and 20b are polysilicon gates, and regions 21a and 21b are gate oxide layers of the left and right conventional transistors, respectively. Side wall dielectric layers 22a and 22b, which are typically oxide layers, cover sidewalls of the polysilicon gates 20a and 20b. In the S/DOI transistors shown on the left side of FIG. 3, portions 114a and 114b of body 14 remain underneath gate oxide layers 121a and 121b, respectively, which underlay polysilicon gates 120a and 120b, respectively. Gates 120a and 120b have on side walls thereof side wall spacers 120a and 120b, respectively, which are typically silicon oxide. Region 116, which is of a second semiconductive type opposite the first conductivity type, serves as a common source/drain region for the two S/DOI transistors and is formed in body 14. Regions 117a and 117b, also of a second semiconductor type, serve as drain/source regions for the left and right S/DOI transistors, respectively, and are formed in body 14. The source/drain region 116 and drain/source regions 117a and 117b, are typically formed from an ion-implanted, deposited amorphous silicon layer, as will be described in more detail herein below. Underlying the source/drain region 116 and drain/source regions 117a and 117b of the S/DOI transistors is a segmented silicon oxide layer 124, which is formed as is described herein below. This layer of silicon oxide 124 restricts the flow of parasitic currents from the source/drain region 116 and drain/source regions 117a and 117b of the S/DOI transistors into the semiconductor body 14. The silicon oxide layer 124 also significantly reduce the capacitance of the source/drain region 116 and drain/source regions 117a and 117b to the semiconductor body 14. The source/drain region 116 and drain source regions 117a and 117b are resistively connected to the Lightly Doped Drain (LDD) extensions (not shown) which are formed underneath the side wall spacers 122a and 122b, as is described herein below. It is to be noted that the channel regions 118a and 118b of the S/DOI transistors are connected to the respective portions of the semiconductor body 114a and 114b. Thus the S/DOI transistors do not suffer from the floating body effect (FBE) which degrades the performance of transistors formed using a conventional Silicon-on-Insulator SOI process.

FIGS. 4 through 18 illustrate a process for fabricating the semiconductor structure 9 of FIG. 3.

Figure 4:
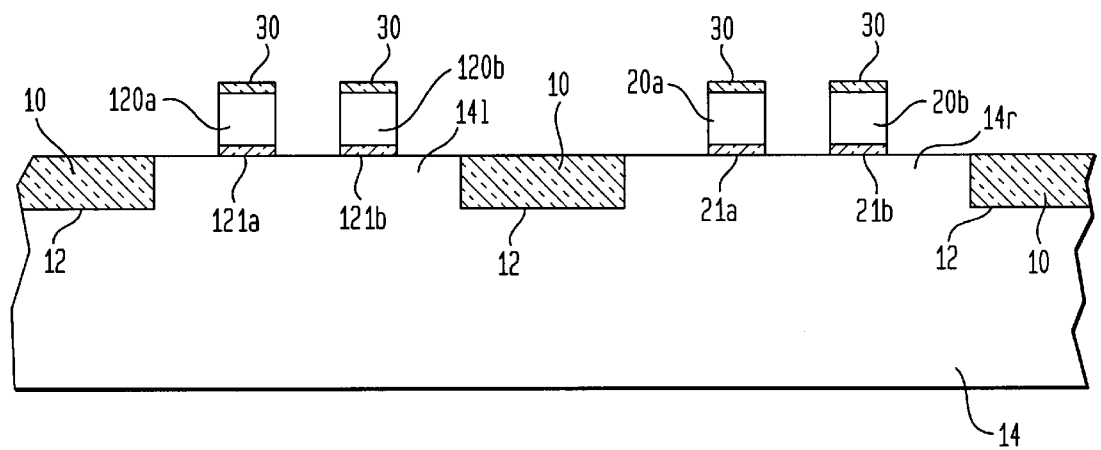
FIGS. 4 through 18 illustrate a process for fabricating the structure of FIG. 3 in accordance with the first illustrative example of the present invention.

FIG. 4 shows a sectional view of the semiconductor structure 9 after initial conventional processing has been completed. Structure 9 at this point in the process flow comprises a semiconductor body 14, which includes portions 14r and 14l that are surrounded by regions of Shallow Trench Isolation STI silicon oxide 10, and polysilicon 20a, 20b, 120a, and 120b are covered on top surfaces thereof by remaining portions of a silicon nitride hard mask 30 which was used in the patterning of the polysilicon.

Figure 5:
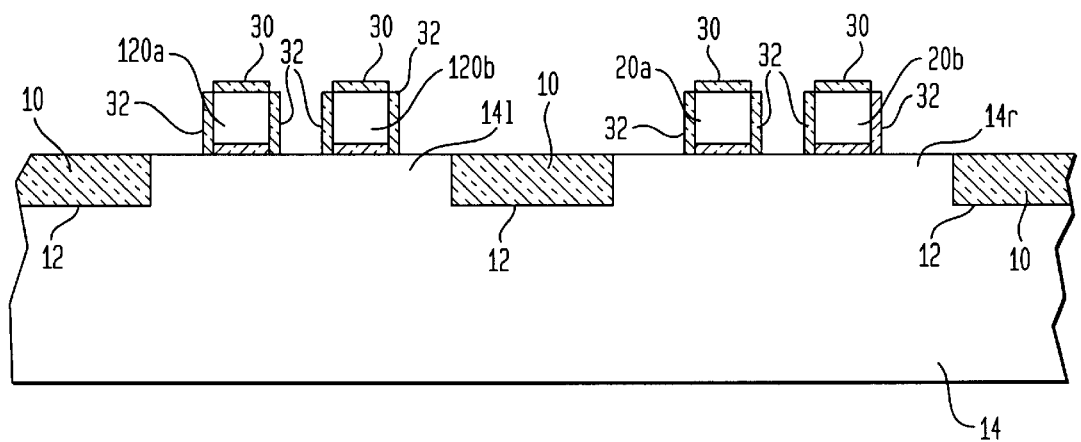
Figure 6:
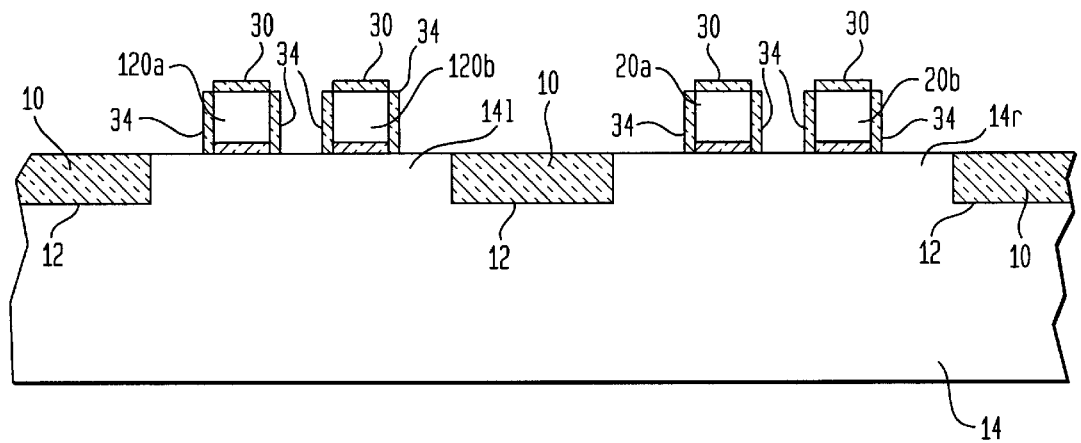

A standard wet clean is done to remove the etch residue following the polysilicon etch. Sidewalls of the polysilicon gates 20a, 20b, 120a, and 120b are then oxidized to a thickness of 5 to 15 nm, dependent upon the process and product being produced. Suitable masking is applied and a Lightly Doped Drain (LDD) extension implantation (not shown) to form n-channel transistors is now performed and the structure is annealed. A second layer of silicon oxide is now deposited on the side walls of the polysilicon gates 20a, 20b, 120a and 120b to form side wall spacers 32, as is shown in FIG. 5. Spacers 32 each include the previous oxide grown on the sidewalls of gates 20a, 20b, 120a and 120b. Suitable masking is applied, and a second Lightly Doped Drain extension implantation (not shown) is performed to form p-channel transistors, and the structure is annealed. A third layer of silicon oxide is now deposited on the sidewalls of the polysilicon gates to form a spacer 34, as is shown in FIG. 6. Spacer 34, as shown, includes the previous spacer 32.

All the processing up to this point follows conventional processes for the forming of a conventional CMOS Integrated Circuit.

Figure 7:
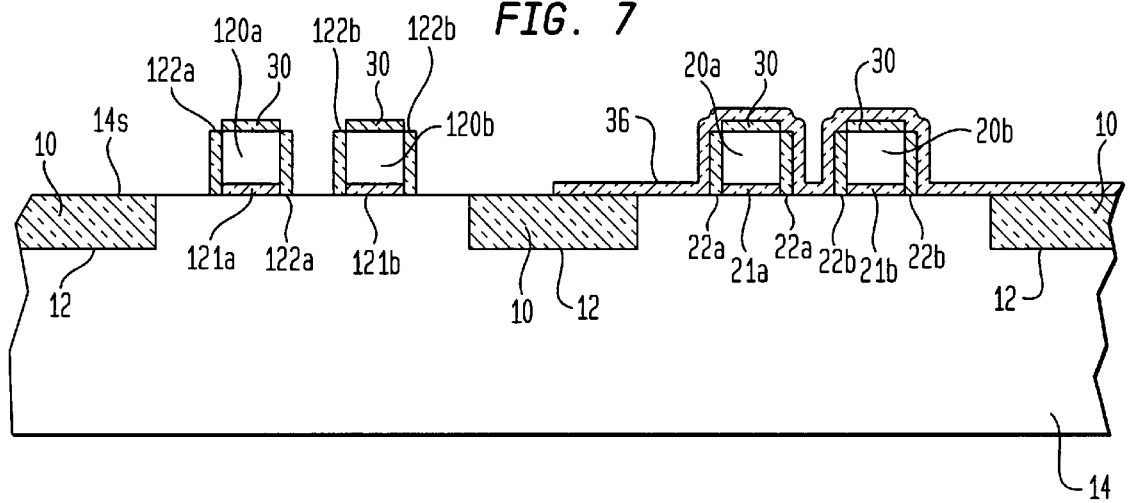

FIG. 7 illustrates the structure after the next steps in this first illustrative example, which are the first steps of the innovative method of this invention for forming S/DOI transistors. A blocking layer 36 of silicon nitride is deposited over the surface of the semiconductor body 14. A typical value for the thickness of layer 36 is approximately 20 nm. Standard photolithography techniques are then used to define regions where the blocking silicon nitride layer 36 will remain, and where conventional transistors will be formed. The blocking silicon nitride layer 36 is removed by etching from the region where S/DOI transistors are to be formed. The etchant used should etch silicon nitride but not attack silicon or silicon oxide.

Figure 8:
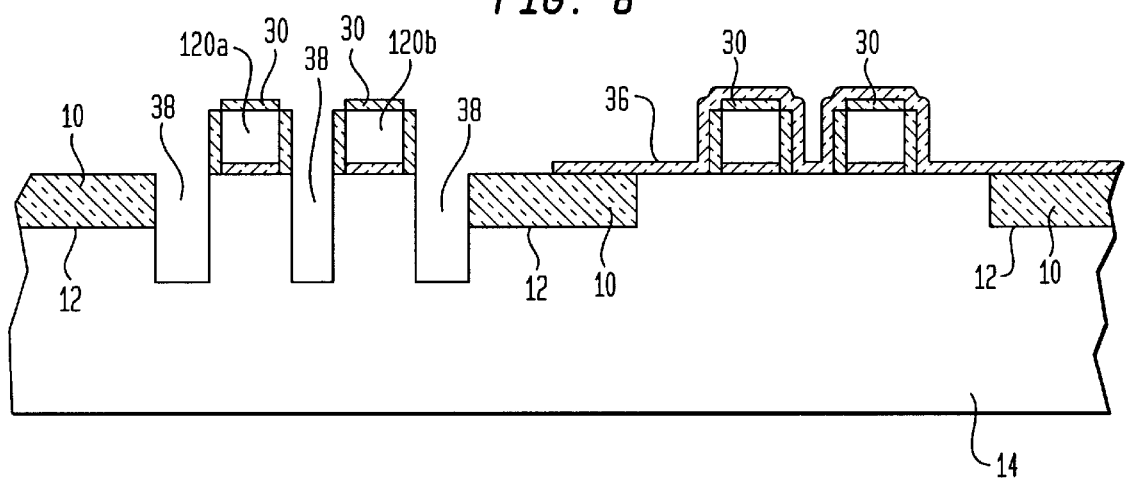

FIG. 8 illustrates the structure after the next steps in the process. An anisotropic etch which selectively removes silicon is used to remove the silicon from portions of body 14 adjacent to the polysilicon gates 120a and 120b to from trenches 38. In a typical embodiment the silicon is removed in these trenches 38 to a depth such that the bottom thereof is approximately 60 nm beneath the interface surface 12 between STI oxide 10 and the semiconductor body 14. The silicon underneath the polysilicon gates 120 is not removed.

Figure 9:
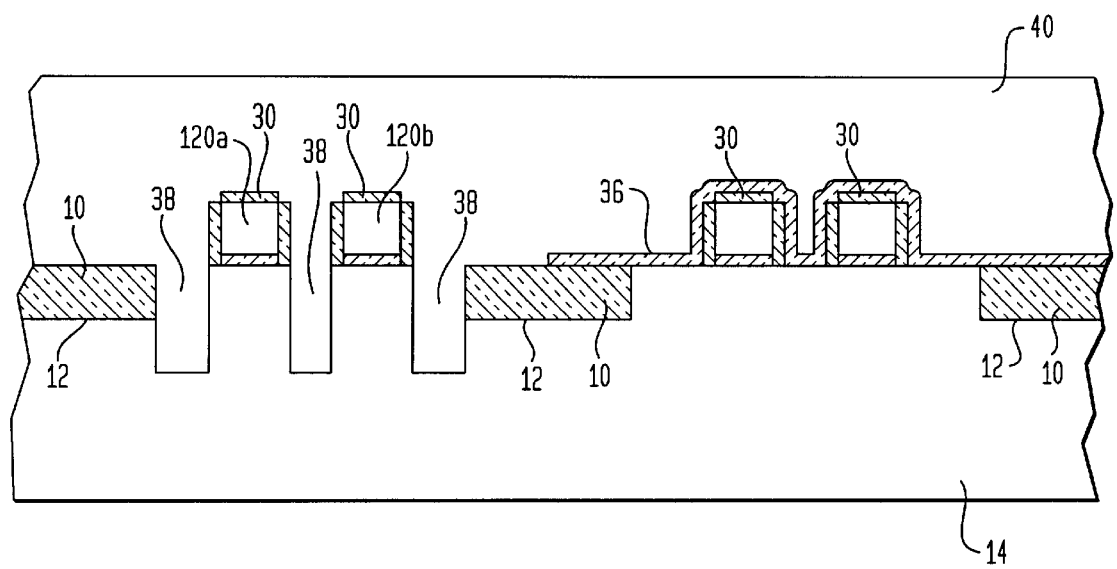

FIG. 9 illustrates the structure after a layer 40 of intrinsic, undoped amorphous silicon has been deposited on the semiconductor body 14. This layer of amorphous silicon 40 fills the trenches 38 where the silicon adjacent to the polysilicon gates 120a and 120b was removed in the previous step.

Figure 10:
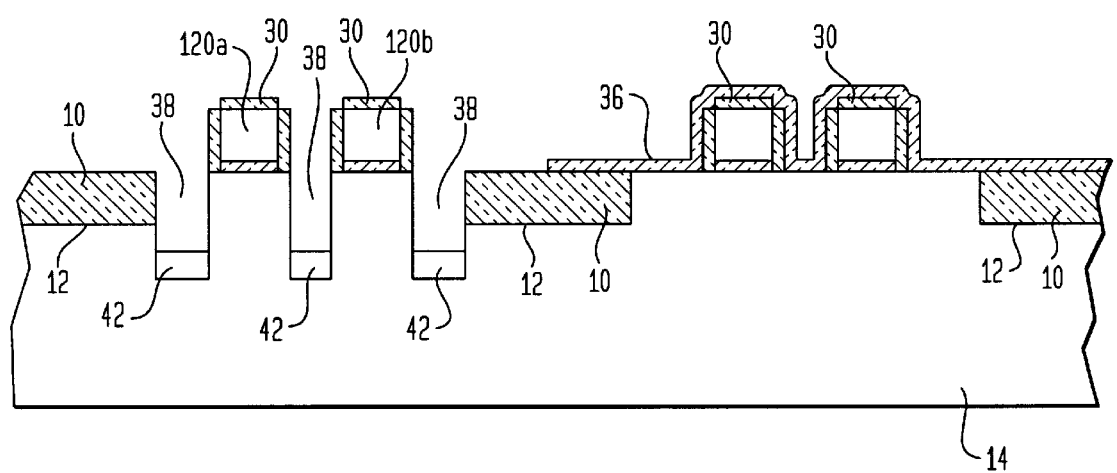

FIG. 10 illustrates the structure after the amorphous silicon layer 40 is anisotropically etched from the surface of the semiconductor body 14. The etch used should selectively etch silicon, and not etch silicon nitride or silicon oxide. In a typical embodiment the etch is controlled to leave approximately 30 nm of silicon 42 in the bottoms of the trenches 38.

Figure 11:
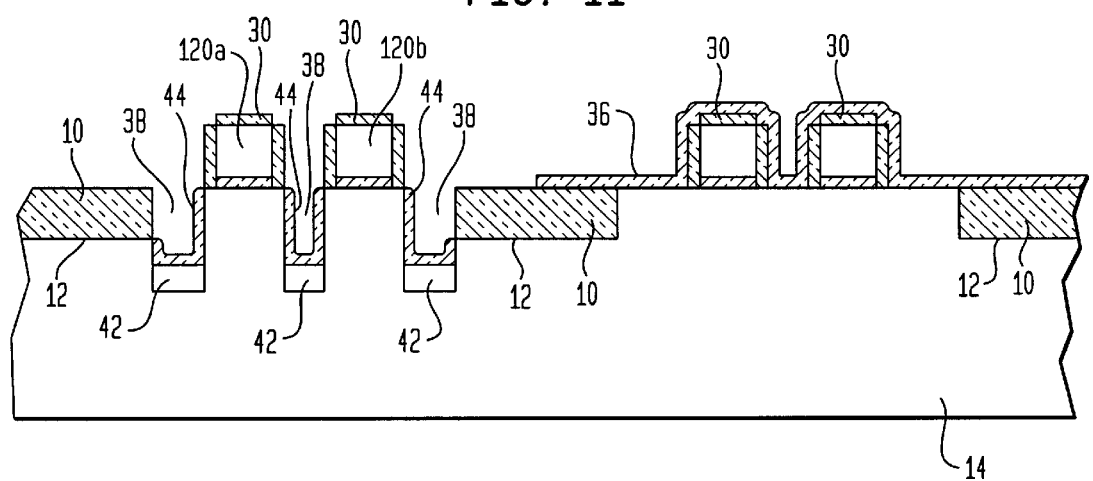

FIG. 11 illustrates the structure after the semiconductor body 14 has been subjected to a Rapid Thermal Nitridation RTN process which forms a layer of silicon nitride 44 with a typical thickness of approximately 5 nm on all exposed silicon surfaces.

Figure 12:
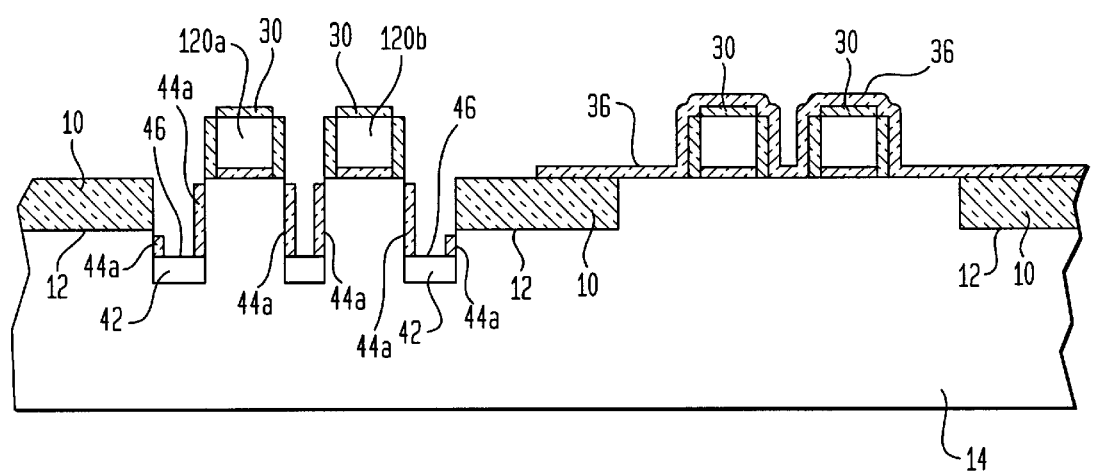

FIG. 12 illustrates the structure after the semiconductor body 14 has been exposed to an anisotropic etch which removes the silicon nitride layer 44 from most of the top surface of the amorphous silicon 42 exposed in the area 46, but leaves the silicon nitride 44 on the sidewalls of the silicon underneath the polysilicon gates 120 and underneath the STI oxide 10, and also leaves the majority of the thickness of the blocking nitride layer 36.

Figure 13:
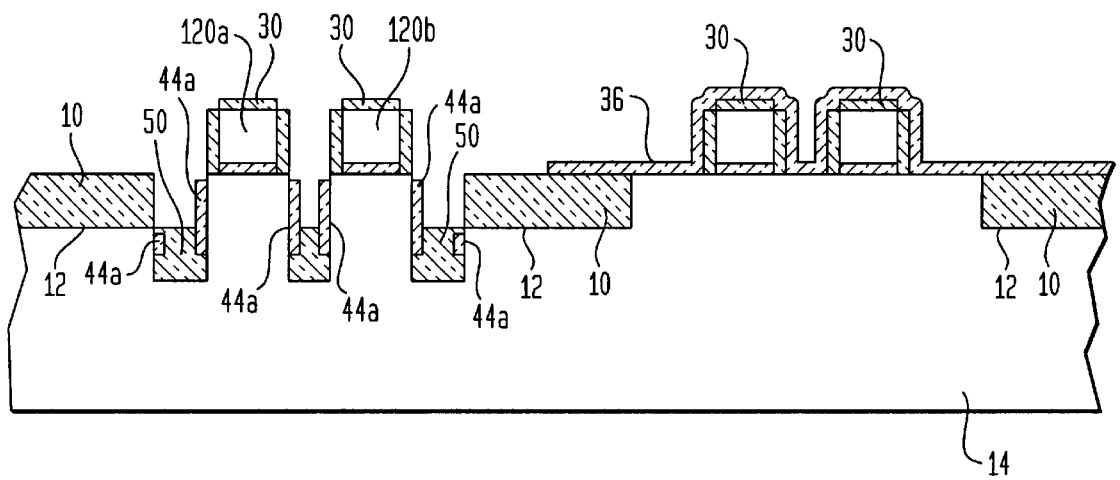

FIG. 13 illustrates the structure after the semiconductor body 14 has been exposed to a Rapid Thermal Oxidation RTO process which oxidizes the exposed amorphous silicon 42 resulting in a layer of silicon oxide 50 of thickness in the range 50 to 80 nm. The top surface of silicon oxide 50 should be approximately coplanar or overlap with an interface 12 between STI oxide 10 and the semiconductor body 14.

Figure 14:
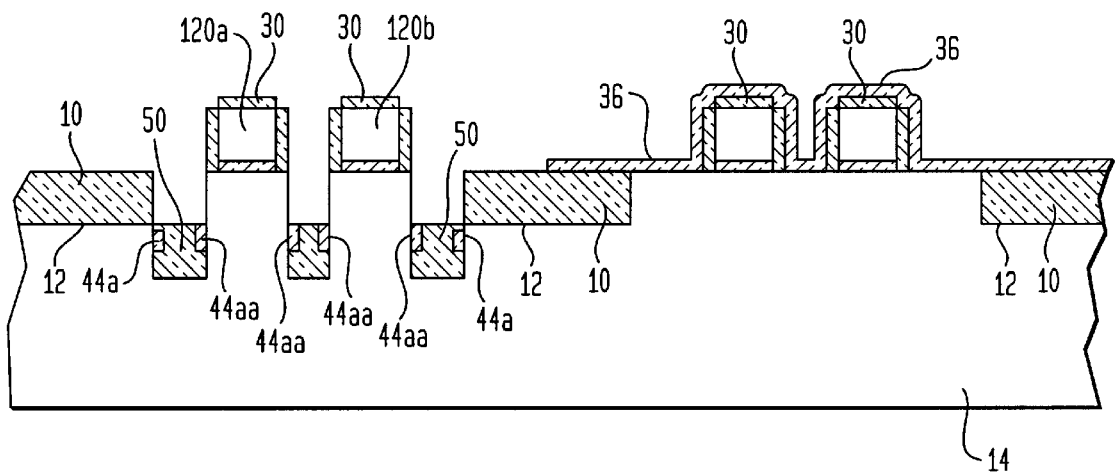

FIG. 14 illustrates the structure after the semiconductor body 14 has been exposed to an isotropic silicon nitride etch which removes the exposed portion of the remaining RTN silicon nitride layer 44 but leaves the buried portions 44a and 44aa, and the majority of the thickness of the blocking nitride layer 36.

Figure 15:
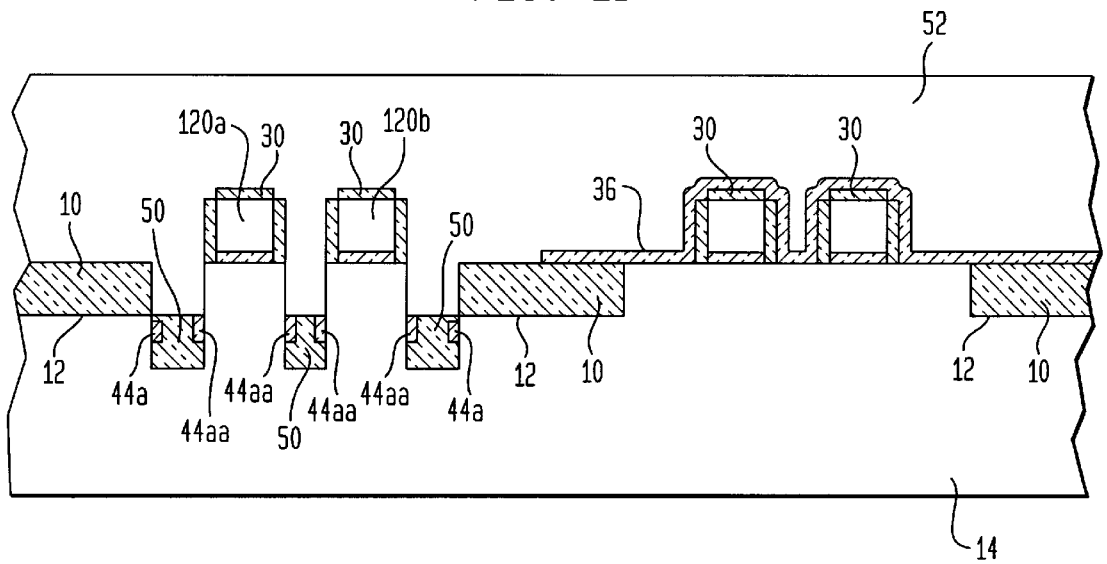

FIG. 15 illustrates the structure after a second layer of undoped intrinsic amorphous silicon 52 has been deposited on the semiconductor body 14. This layer of amorphous silicon fills the area adjacent to the polysilicon gates 120a and 120b. Care must be taken to prevent the formation of a native oxide interface between the intrinsic polysilicon film 52 and the sides of the silicon body region 114a and 114b.

Figure 16:
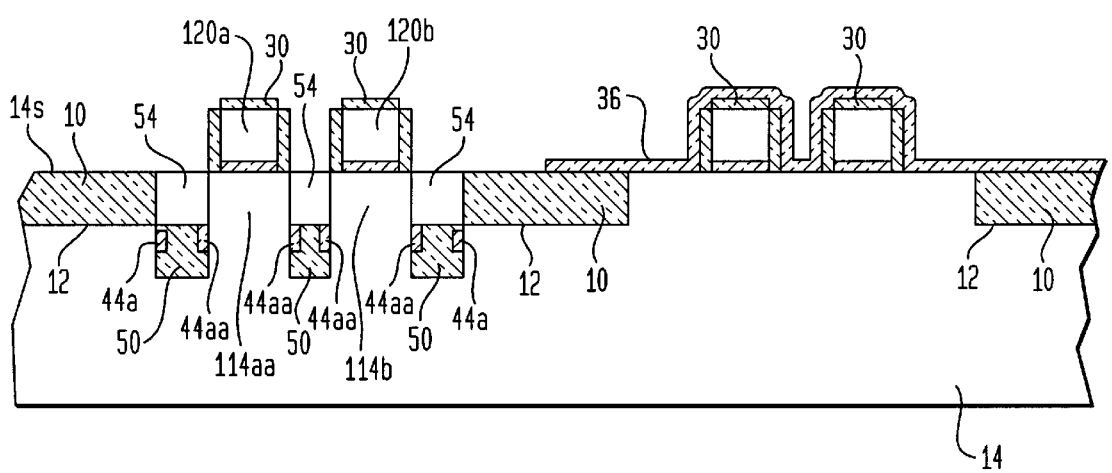

FIG. 16 illustrates the structure after the semiconductor body 14 has been exposed to an etch which removes the amorphous silicon 52 to surface 14s such that all of the silicon is removed above STI 10. The etch should selectively etch amorphous silicon, and not etch silicon oxide or silicon nitride. This leaves behind portions 54 of amorphous silicon region 52, which are adjacent to, and conductively connected to portions 114a and 115b of the semiconductor body 14 underneath the polysilicon gates 120a and 120b.

Figure 17:
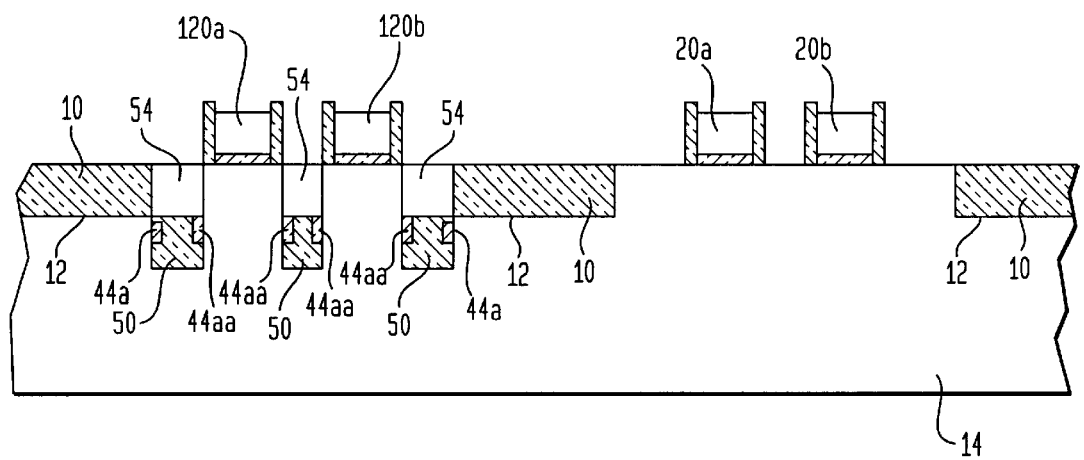

FIG. 17 illustrates the structure after the semiconductor body has been exposed to an etch which completely removes the blocking silicon nitride hard mask 30 and silicon nitride layer 36. The etch should selectively etch silicon nitride, and not etch silicon oxide or amorphous silicon and crystalline silicon.

Figure 18:
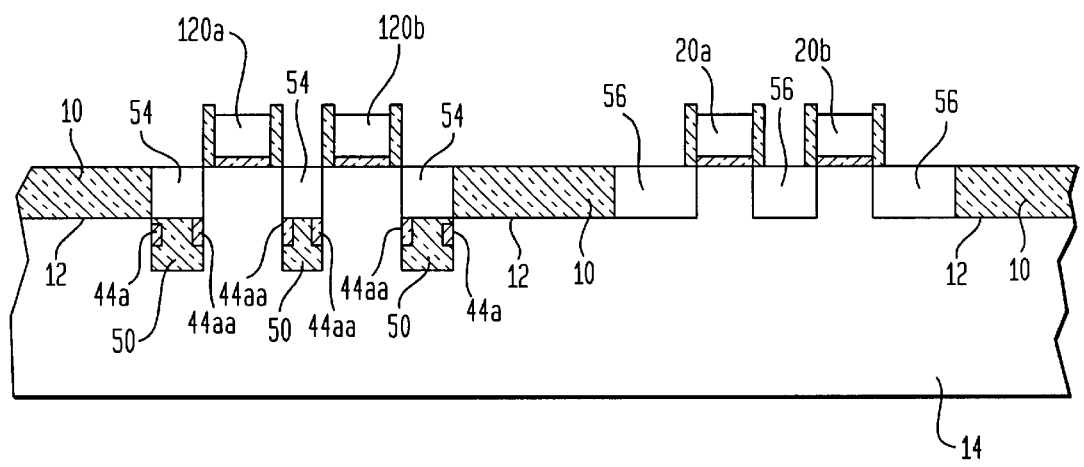

Finally, FIG. 18 illustrates the structure after the semiconductor body 14 has been exposed to suitable masking and ion implantation to selectively dope the polysilicon gates 20a, 20b, 120a and 120b, and the amorphous silicon regions 54 and the crystalline silicon regions 56, to selectively form either n-channel or p-channel transistors. These masking and ion implantation operations would be the same as those used in the conventional processing sequence for forming conventional CMOS transistor or Integrated Circuits, and the process sequence from this point forward would follow the conventional process sequence.

One alternative variation of the process described in the above first illustrative example of the present invention would result in the elimination of several of the process steps described above, namely the deposition of a first layer 40 of intrinsic, undoped amorphous silicon, illustrated in FIG. 9, and the subsequent anisotropic etch of the layer 40. Starting with the structure as described in FIG. 7, an anisotropic etch which selectively removes silicon is used to remove the silicon from the regions 38 adjacent to the polysilicon gates 120a and 120b, as is shown in FIG. 8. The silicon is removed to a lesser depth than described previously so that the resulting structure is similar to that described in FIG. 10, except that the region 42 is now a portion of the body 14, rather than a remaining portion of the layer 40 of amorphous silicon. The process then continues as described above with the semiconductor body being subjected to a Rapid Thermal Nitridation RTN process to form the layer of silicon nitride 44 as shown in FIG. 11.

Figure 19:
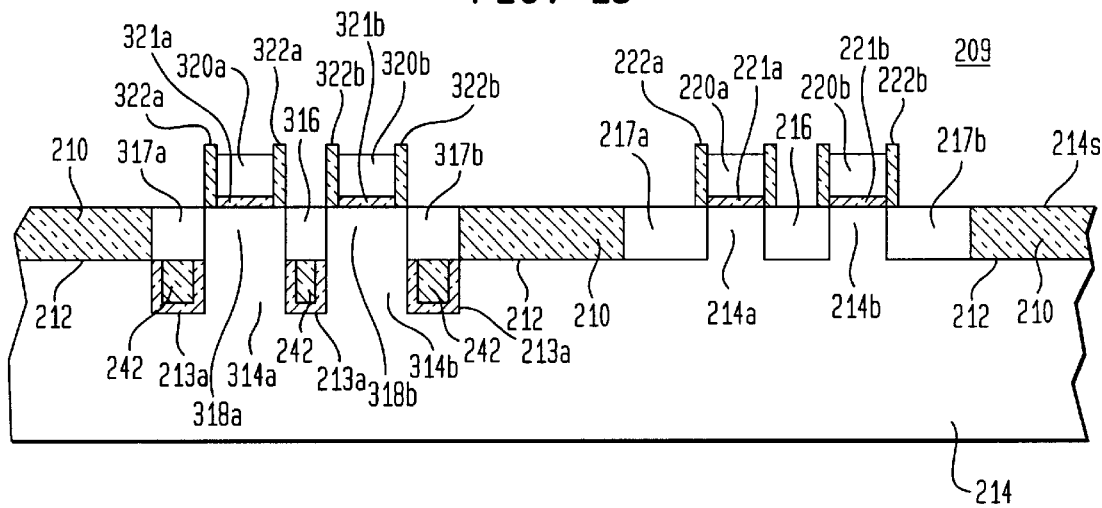
FIG. 19 shows a semiconductor structure in accordance with the second illustrative example of the present invention.

Referring now to FIG. 19, there is shown a sectional view of a semiconductor structure 209 comprising two partially completed Source/Drain-On-Insulator (S/DOI) field effect transistors (shown on the left) and two partially completed conventional field effect transistors (shown on the right) fabricated in a common semiconductor body 214 in accordance with a second embodiment of the present invention. Semiconductor body 214, which is of a first conductivity type, is typically silicon, and has a major surface 214s. A Shallow Trench Isolation (STI) 210, surrounds the two groups of transistors and extends from the major surface 214 into body 214 to a surface 212. With respect to the conventional transistors, a semiconductor region 216, which is of the opposite conductivity type of body 214, serves as a common source/drain region for the two conventional transistors and is formed in body 214. Regions 217a and 217b, also of the opposite conductivity type, serve as drain/source regions of the left and right conventional transistors, respectively, and are formed in body 214. Regions 214a and 214b of body 214 are channel regions, regions 220a and 220b are polysilicon gates, and layers 221a and 221b are gate oxide layers, of the left and right transistors, respectively. Layers 222a and 222b are oxide layers which cover the sidewalls of the polysilicon gates 220a and 220b, respectively.

In the S/DOI transistors shown on the left, portions 314a and 314b of semiconductor body 214 are underneath the polysilicon gates 320a and 320b, respectively. Gates 320a and 320b have the oxide layers 322a and 322b, respectively, on sides thereof. Common source/drain region 316 and the drain/source regions 317a and 317b of the left and right transistors, respectively, are typically formed from an ion-implanted, deposited amorphous silicon layer, as will be described in more detail herein below. Underlying the source/drain region 316 and drain/source regions 317a and 317b of the S/DOI transistors is a silicon oxide layer 242, on whose lower surface and sidewalls is a layer of silicon nitride 213a, which layers are formed as is described herein below. These layers of silicon oxide 242 and silicon nitride 213a restrict the flow of parasitic currents from the source/drain region 316 and drain source regions 317a and 317b of the S/DOI transistors into the semiconductor body 214. The silicon oxide layers 242 and silicon nitride layers 213a also significantly reduce the capacitance of the source/drain region 316 and drain source regions 317a and 317b to the semiconductor body 214. The source/drain region 316 and drain source regions 317a and 317b are resistively connected to the Lightly Doped Drain (LDD) extensions (not shown) which are formed underneath the deposited oxide regions 322a and 322b, as is described herein below. It is to be noted that channel regions 318a and 318b of the S/DOI transistors are subportions of portions 314a and 314b, respectively, of body 214. Thus the S/DOI transistors do not suffer from the floating body effect (FBE) which degrades the performance of transistors formed using a conventional Silicon-on-Insulator SOI process.

Figure 20:
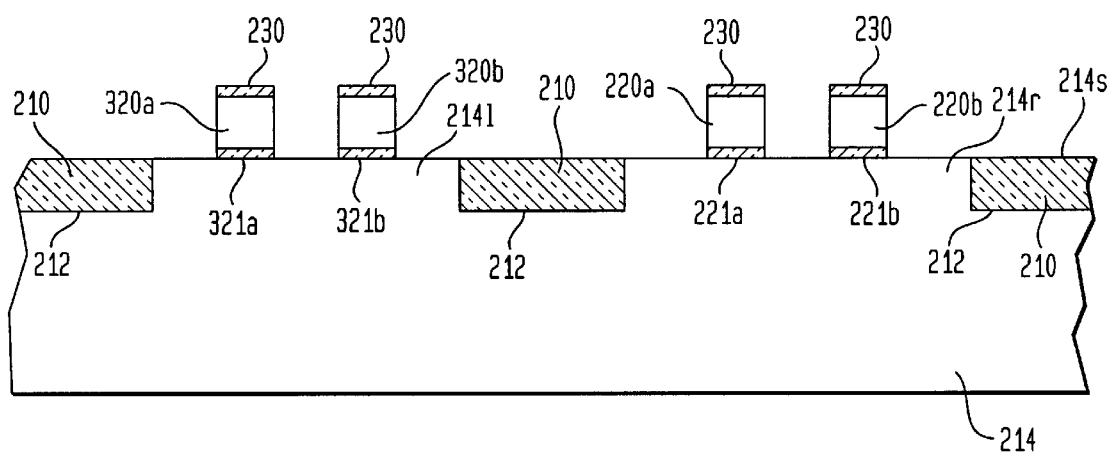
FIGS. 20 through 32 illustrate a process for fabricating the structure of FIG. 19 in accordance with the second illustrative example of the present invention.

FIG. 20 shows a sectional view of the semiconductor structure 209 after initial conventional processing has been completed. Structure 209 at this point in the process flow comprises a semiconductor body 214, which includes portions 214r and 214l that are surrounded by regions of Shallow Trench Isolation STI silicon oxide 210, and polysilicon gate conductors 220a, 220b, 320a, and 320b, which are separated from the portions of the semiconductor body 214r and 214l by layers of thin gate oxide 221a, 221b, 321a, and 321b, respectively. The polysilicon gate conductors 220a, 220b, 320a and 320b are covered on their top surface with the remaining portions of a silicon nitride hard mask 230 which was used in the patterning of the polysilicon.

Figure 21:
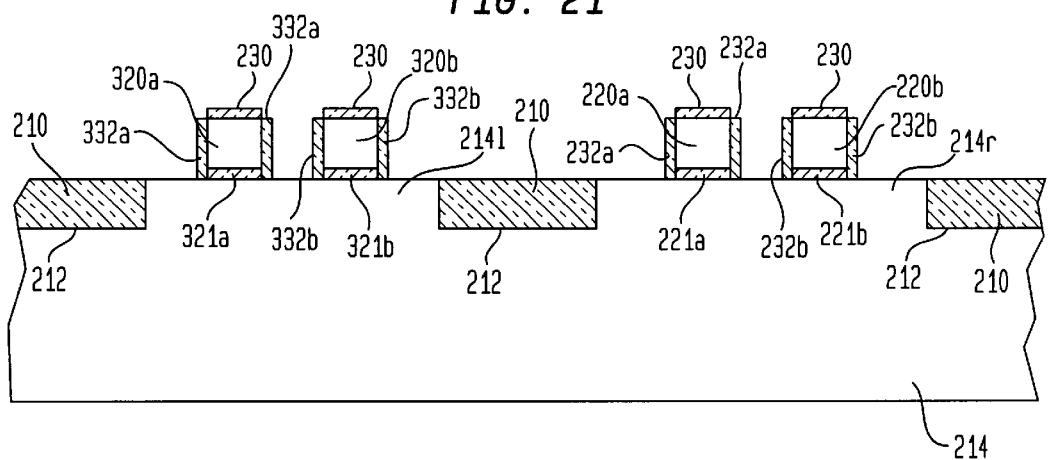
Figure 22:
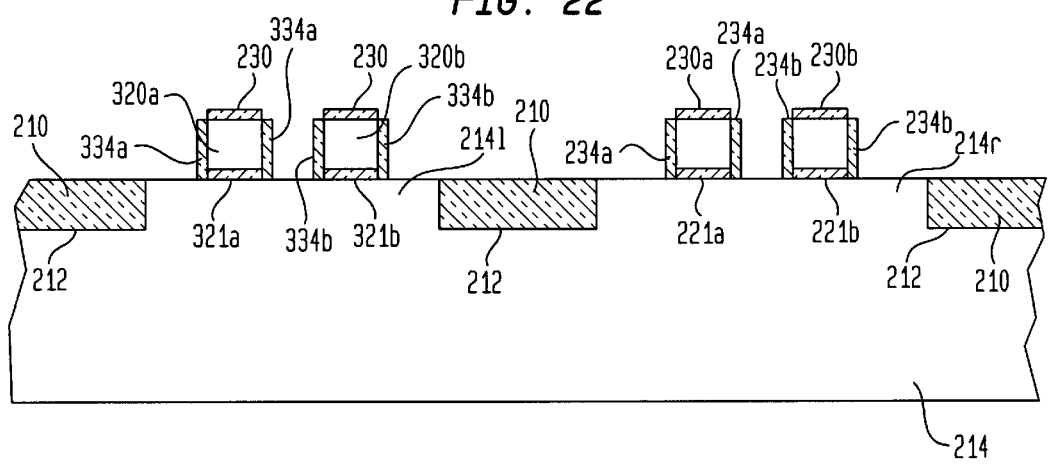

A standard wet clean is done to remove the etch residue following the polysilicon etch. Typically, this etch is chosen to selectively remove materials other than silicon oxide. The sidewalls of the polysilicon gates are then oxidized to a thickness of 5 to 15 nm, dependent upon the process and product being produced. Suitable masking is applied and a Lightly Doped Drain LDD extension implantation to form n-channel transistors is now performed and the structure is annealed. A second layer of silicon oxide is now deposited on the sidewalls of the polysilicon gates 220a, 220b, 320a and 320b to form sidewall spacers 232a, 232b, 332a and 332b (shown in FIG. 21). Spacers 232a, 232b, 332a and 332b include the previous oxide grown on the sidewalls of gates 220a, 220b, 320a and 320b. Suitable masking is applied, and a second Lightly Doped Drain (LDD) extension implantation (not shown) is performed to form p-channel transistors, and the structure is annealed. A third layer of silicon oxide is now deposited on the sidewalls of the polysilicon gates 32a, 32b, 220a, and 220b to form spacers 234a, 234b, 334a and 334b, respectively, as is shown in FIG. 22. Spacers 234a, 234b, 334a and 334b, as shown, include the previous spacers 232a, 232b, 332a and 332b.

All the processing up to this point follows conventional processes for forming a conventional CMOS Integrated Circuit.

Figure 23:
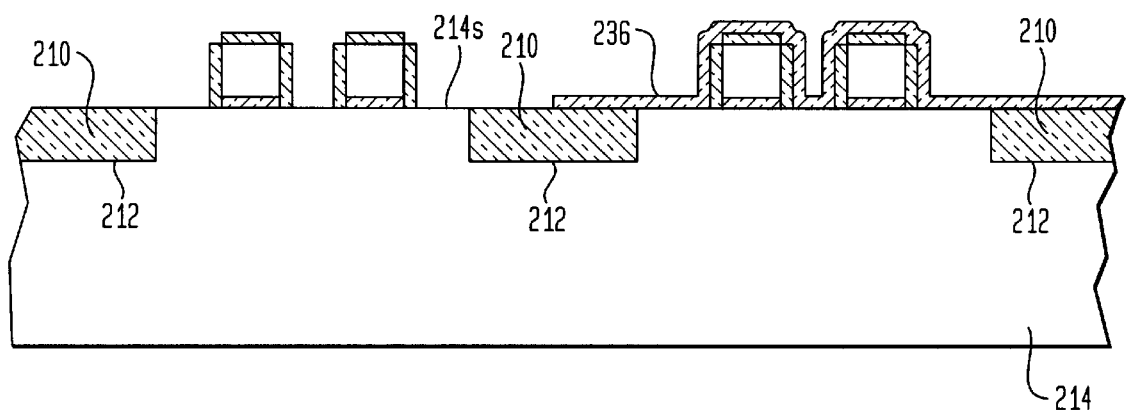

FIG. 23 illustrates the structure after the next steps in this second illustrative example, which are the first steps of the innovative method of this invention for forming S/DOI transistors. A blocking layer of silicon nitride 236 of thickness approximately 20 nm is deposited over the surface 214s of the semiconductor body 214. Standard photolithography techniques are then used to define regions where the blocking silicon nitride layer 236 will remain, and where conventional transistors will be formed. The blocking silicon nitride is removed by etching from the region where S/DOI transistors are to be formed. The etchant used should etch silicon nitride but not attack silicon or silicon oxide.

Figure 24:
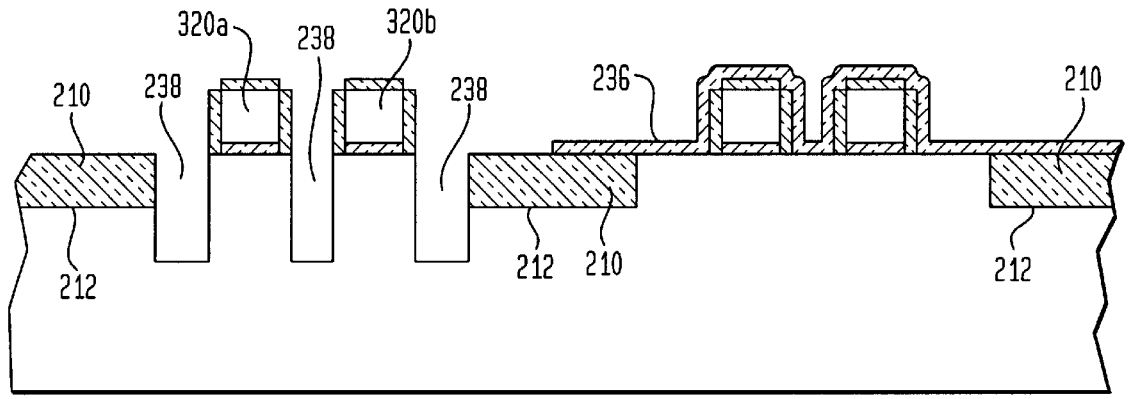

FIG. 24 illustrates the structure after the next steps in the process. An anisotropic etch which selectively removes silicon is used to remove the silicon from regions adjacent to the polysilicon gates 320a and 320b to from trenches 238. Silicon is removed in these regions to a depth such that the bottom of trenches 238 is typically approximately 60 nm beneath the surface 212 between STI oxide 210 and the semiconductor body 214. The silicon underneath the polysilicon gates 320a and 320b is not removed.

Figure 25:
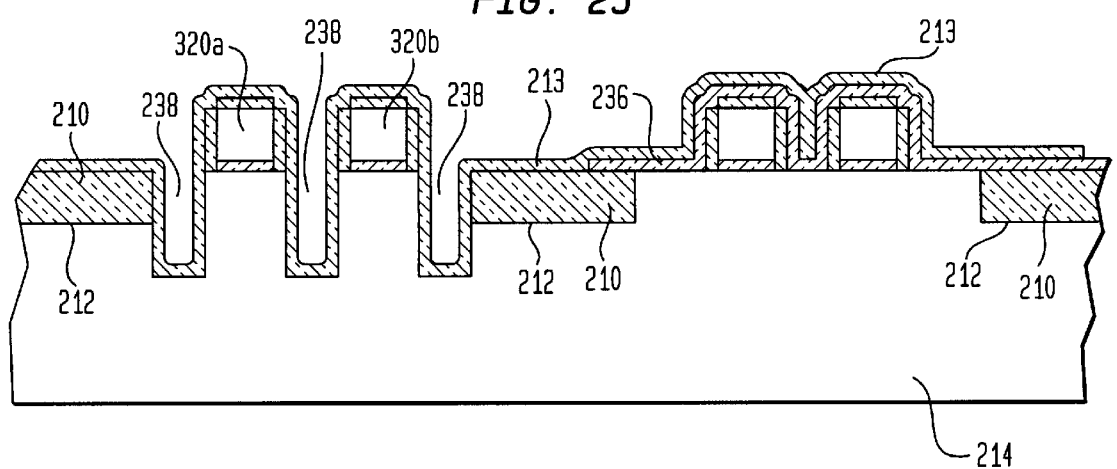

FIG. 25 illustrates the structure after a conformal layer of silicon nitride 213 has been deposited over the surface of the semiconductor body 214. Material other than silicon nitride may be used for this conformal layer. For example, a layer of polysilicon could be used. For the purposes of this detailed description, it is assumed that silicon nitride has been used.

Figure 26:
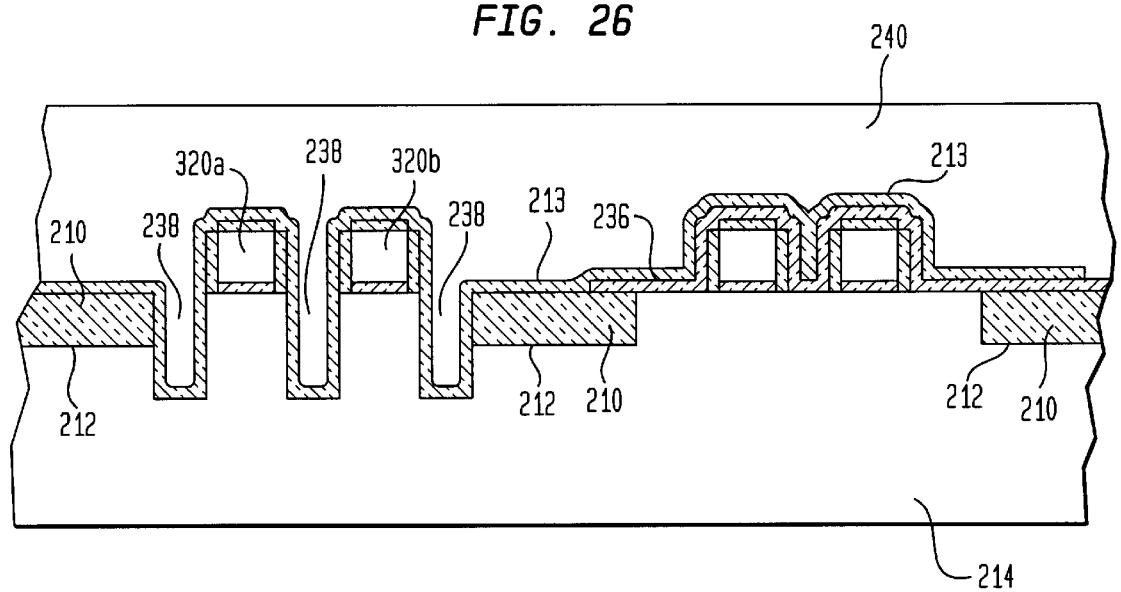

FIG. 26 illustrates the structure after a layer of silicon oxide 240 has been deposited on the semiconductor body 214. This layer of silicon oxide 240 fills the trenches 238 where the silicon adjacent to the polysilicon gates 320a and 320b was removed in the previous step.

Figure 27:
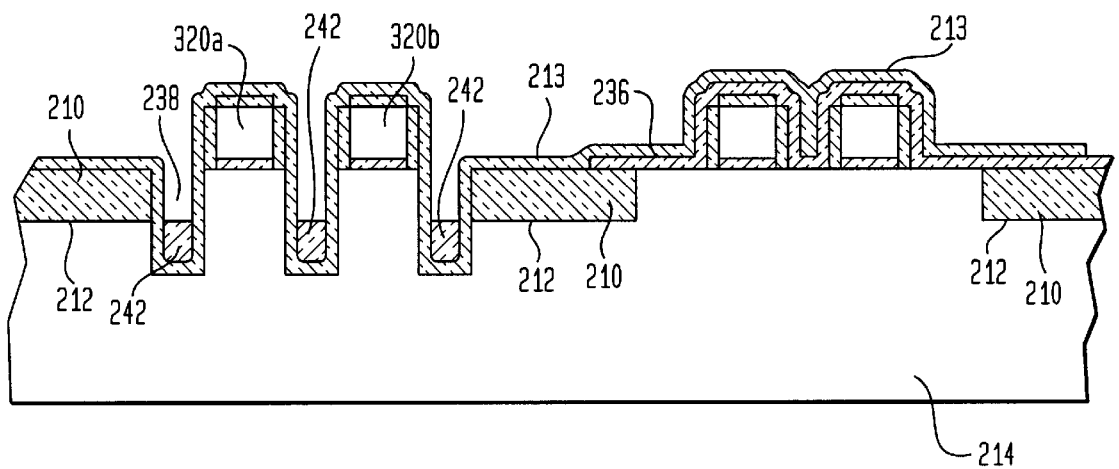

FIG. 27 illustrates the structure after the silicon oxide layer 240 is partially etched from the surface of the semiconductor body 214, leaving silicon oxide region 242 only in bottom portions of trenches 238. The etch used should selectively etch silicon oxide, and not etch silicon nitride or silicon. The etch is controlled to typically leave approximately 50 to 80 nm of silicon oxide 242 in the bottoms of the trenches 238. This silicon oxide region 242 should typically be at or above the interface 212 between the STI oxide 210 and the semiconductor body 214.

Figure 28:
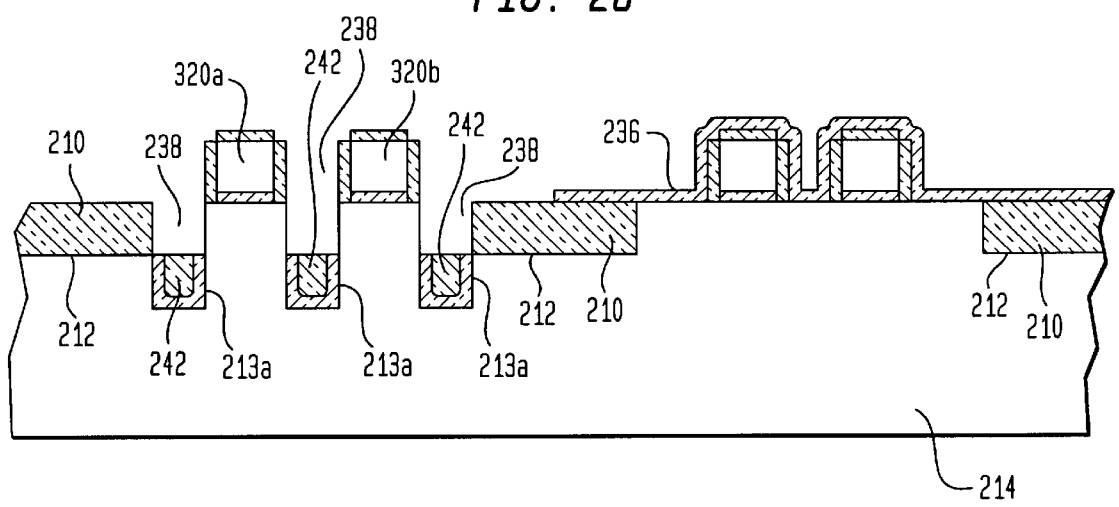

FIG. 28 illustrates the structure after the semiconductor body has been exposed to an isotropic etch which removes the silicon nitride layer 213 from the top surface of the semiconductor body 214, and from the sidewalls of the portions of regions 238 which are not filled with silicon oxide layer 242, leaving remaining portion 213a. Care must be taken to leave the majority of the thickness of the blocking nitride layer 236.

Figure 29:
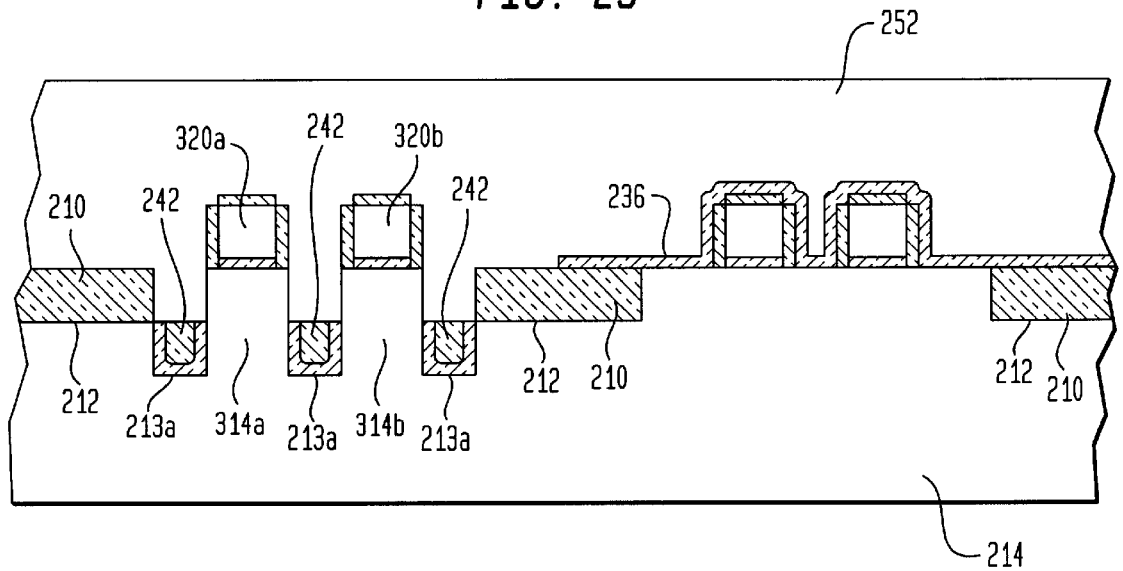

FIG. 29 illustrates the structure after a layer of undoped intrinsic amorphous silicon 252 has been deposited on the semiconductor body 214. This layer of amorphous silicon fills the unfilled portions of trenches 238. Care must be taken to inhibit oxide growth prior to the deposition of the amorphous silicon, so that there is no oxide between the amorphous silicon and the portions of the semiconductor body 314a and 314b under the gates 320a and 320b.

Figure 30:
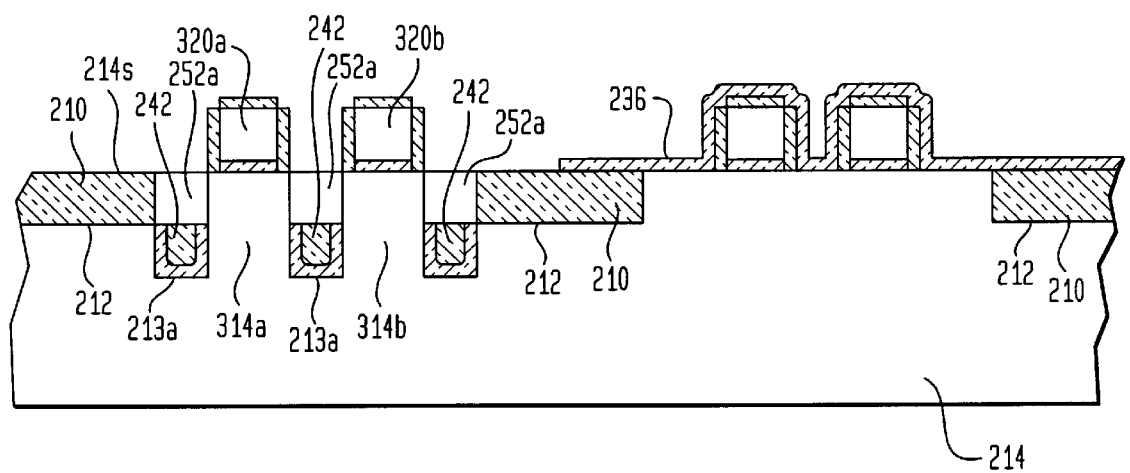

FIG. 30 illustrates the structure after the semiconductor body 214 has been exposed to an etch which removes a portion of the amorphous silicon layer 252 to a level just below the surface of the STI oxide 210. The etch should selectively etch amorphous silicon, and not etch silicon oxide or silicon nitride. This leaves behind remaining portions 252a of amorphous silicon regions 252, which are adjacent to, and conductively connected to, the silicon underneath the polysilicon gates 320a and 320b.

Figure 31:
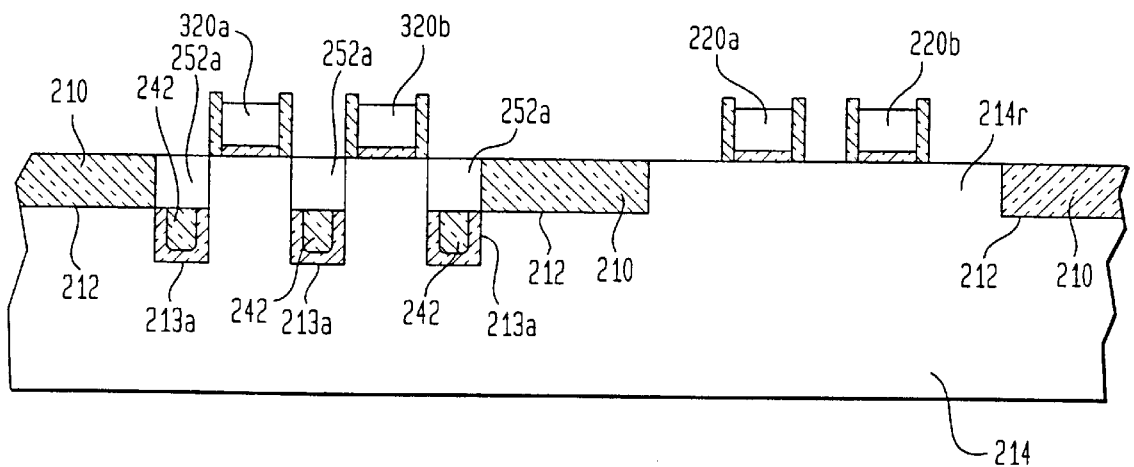

FIG. 31 illustrates the structure 209 after the semiconductor body 214 has been exposed to an etch which completely removes the silicon nitride hard mask 230 and the blocking nitride layer 236. The etch should selectively etch silicon nitride, and not etch silicon oxide, amorphous silicon, or crystalline silicon.

Figure 32:
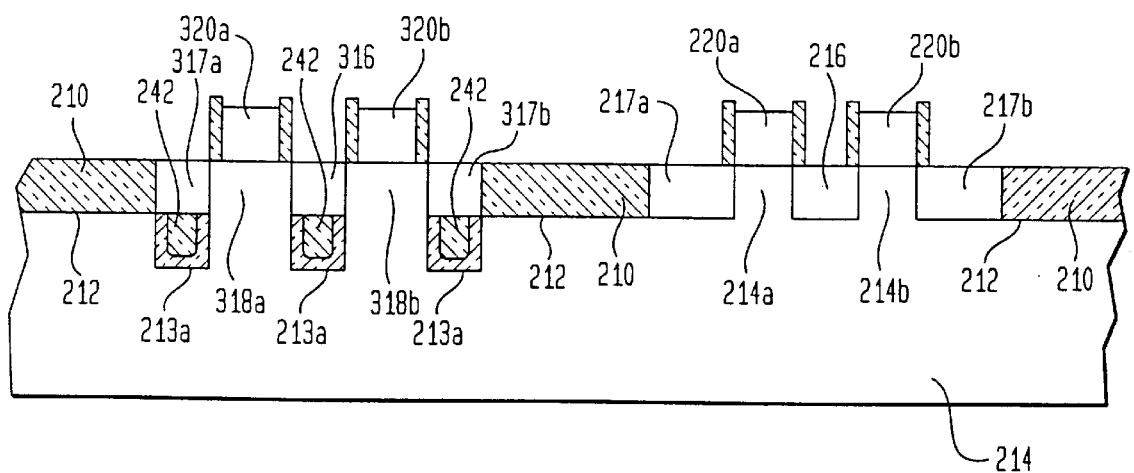

Finally, FIG. 32 illustrates the structure 209 after the semiconductor body has been exposed to suitable masking and ion implantation to selectively dope the polysilicon gates 220a, 220b, 320a and 320b, amorphous silicon regions 254, and the portions of the crystalline silicon regions 214r not underneath gates 220a and 220b, to selectively form either n-channel or p-channel transistors with source/drain regions 316 and 216 and drain source regions 317a, 317b, 217a and 217b. These masking and ion implantation operations would be the same as those used in the conventional processing sequence for forming conventional CMOS transistor or Integrated Circuits, and the process sequence from this point forward would follow the conventional process sequence.

It is to be understood that the particular structures and processes described are merely illustrative of the general principles of the invention. Various modifications are possible without departing from the spirit and scope of the invention. For example, the semiconductor body could be of p-type or n-type conductivity or could be gallium arsinide or another semiconductor such as Germanium. Further, the transistors formed could be all n-channel or all p-channel, rather than the combination of both n-channel and p-channel transistors described herein. Further, other dielectric materials than silicon oxide or silicon dioxide could be used to fill the bottom of the trenches, and the dielectric could be either a single material or a composite of several materials. Still further, the source/drain regions could be semiconductor materials other than silicon, and could be either amorphous, partially recrystallized, polycrystalline, or fully single crystal, or Germanium, or a combination of some haveing silicon and other having Germanium. Still further, the source/drain regions could be of a different semiconductor material than the semiconductor body. Still further, the structure of the region which defines the active areas could be different than the Shallow Trench Isolation (STI) structure illustrated, and could use dielectric material other than silicon oxide or silicon dioxide. Further, transistors having a geometry which is different than those described can be used. Furthermore, the concepts described herein may be applied to other types of devices and transistors, such as, for example, bipolar transistors, and in general to all types of semiconductor devices where it is necessary to reduce the parasitic current flowing between various devices, to reduce the capacitance between various elements of the devices, and also to provide a known potential to the semiconductive material in which the device is fabricated.

What is claimed is:

1. A semiconductor structure comprising:
   a semiconductor body having a surface and being of a first conductivity type;
   a gate region being separated from the surface by a gate dielectric layer;
   first and second semiconductor regions being located in portions of the semiconductor body, being separated from each other by a portion of the body located under the gate region, and being of a second conductivity type which is opposite the first conductivity type;
   the first and second semiconductor regions and the gate region serving as first and second outputs and a gate, respectively, of an insulated gate field effect transistor; and
   the first and second semiconductor regions being electrically isolated from the body by a dielectric region and by a dielectric layer except for a vertical surface of each which is located below the gate region and is in electrical contact with the body.

2. A semiconductor structure comprising:
   a semiconductor body having a bulk portion of one conductivity type and a top surface;
   first and second semiconductor regions of the opposite conductivity type which are separated by a portion of the semiconductor body and which have a top surface at the same level as the surface of the semiconductor body;
   a gate region separated from the top surface of the semiconductor body by a gate dielectric layer with the first and second regions being separated by the portion of the semiconductor body below the gate region; and
   the first and second regions being electrically isolated from the semiconductor body except for a vertical surface of each which is located below the gate region and is in electrical contact with the bulk portion of the semiconductor body.

3. A semiconductor structure comprising:
   a crystalline semiconductor body of a first conductivity type;
   a polysilicon gate separated from an underlying region of the body by a gate dielectric layer of silicon oxide;
   source and drain regions of amorphous semiconductor which are of the opposite conductivity type of the body, being in contact with the body, and being separated by a portion of the body; and
   said source and drain regions being electrically isolated from the semiconductor body except a vertical surface of each which is located below the polysilicon gate and is in electrical contact with the bulk portion of the semiconductor body.

4. The semiconductor structure of claim 3 wherein the electrical isolation of the source and drain regions comprises a dielectric region partly surrounding the regions and a dielectric layer under each of the regions.

5. The semiconductor structure of claim 4 wherein the dielectric layer under each of the regions is oxidized amorphous silicon.

6. Apparatus comprising:
   a semiconductor body having a major surface and having a bulk portion of a first conductivity type;
   active areas of the body being surrounded by an insulating isolation region which extends from the major surface of the body into the bulk portion of the body;
   at least one of the active areas of the body containing a field effect transistor having a drain region and a source region with both regions being of the opposite conductivity type of the first conductivity region;
   each drain and source region having four side walls and a bottom surface with three of the side walls being in contact with portions of the insulating isolation region and the fourth side wall being in contact with a portion of the bulk of the body and being separated from the fourth side wall of an adjacent region by portions of the bulk of the body; and
   an insulating layer separating the bottom of each drain and source region from the bulk of the body.

7. Apparatus comprising:
   a semiconductor body having a major surface and having a bulk portion of a first conductivity type;
   active areas of the body being surrounded by an insulating region which extends from the major surface of the body into the bulk portion of the body;
   at least one of the active areas of the body containing two field effect transistors sharing a common first output region and having separate second output regions;
   each of the first and second output regions having four side walls and a bottom surface with the first and second side walls of each output region being in contact with portions of the insulating isolation region, the third side wall of each output region being in contact with a portion of the bulk of the body and being separated by portions of the bulk of the body from the a side wall of another output region by portions of the bulk of the body, the fourth side walls of the second output regions being in contact with the insulating isolation region, and the fourth side wall of the first output region being in contact with the bulk portion of the body; and
   an insulating layer separating the bottom of each first and second output regions from the bulk portion of the body.

8. The apparatus of claim 7 wherein the semiconductor body is silicon and the surrounding insulating region and the insulating layer are both silicon oxide.

9. The apparatus of claim 8 wherein the semiconductor body is of p-type conductivity and the first and second regions are of n-type conductivity.

10. The apparatus of claim 7 further comprising a separate gate region located above and between each first and second region and having a gate dielectric layer separating the gate region from the major surface.

11. The apparatus of claim 10 wherein the gate regions are polysilicon and the gate dielectric layers are silicon oxide.

12. A method of fabricating field effect transistors each having a drain region and a source region in a semiconductor body having a major surface and having a bulk of a first conductivity type comprising the steps of:

patterning the body to define active areas in which transistors are to be formed;

forming an insulating isolation region extending from the major surface of the body into the body to surround areas of the wafer in which transistors are to be formed;

etching two trenches in at least one of the active areas with the trenches being separated by portions of the bulk of the body and with each trench having three side walls defined by portions of the insulating isolation region and having a fourth side wall and a bottom surface defined by the bulk of the body;

covering the bottom surface of each trench with an insulating isolation cover layer;

filling the trenches with a semiconductive material; and doping the fill semiconductive material to be of the opposite conductivity type of the bulk portion of the body such that the filled trenches become the drain and source regions of the transistor with the fourth wall side of each pair of drain and source regions being in contact with the bulk of the body and facing each other.

13. A method of fabricating pairs of field effect transistors each having a separate first output region and sharing a common second output region in a semiconductor body having a major surface and having a bulk of a first conductivity type comprising the steps of:

patterning the body to define active areas in which transistors are to be formed;

forming an insulating isolation region extending from the major surface of the body into the body to surround areas in which transistors are to be formed;

etching first, second, and third trenches in at least one of the active areas with the trenches being separated by portions of the bulk of the body and with each trench having first and second two side walls defined by portions of the insulating isolation region and having a third side wall and a bottom surface defined by the bulk portion of the body, the first and third trenches each having a fourth side wall defined by portions of the insulating isolation region, and the second trench having a fourth side wall defined by the bulk portion of the body;

covering the bottom of each trench with an insulating isolation layer;

filling the trenches with a semiconductive material; and doping the fill semiconductive material to be of the opposite conductivity type of the bulk portion of the body such that the filled first and third trenches become the first output region of each of the first and second transistors, respectively, and the filled second trench becomes the common second output region of both transistors with the third and fourth side walls of the second output region being in contact with the bulk of the body and with each facing the third side wall of a separate first output region.

14. A method of forming in a semiconductor body having a major surface and being of a first conductivity type a plurality of insulated gate field effect transistors each having a gate, a drain region, and a source region comprising the steps of:

forming dielectric regions from the major surface of the body into the body so as to define active areas of the surface of the body in which transistors are to be formed;

forming in the active areas gates which are separated from the surface of the body by a gate dielectric layer;

etching exposed portions of the surface adjacent the gates to form a trench on each side of each gate region;

forming in bottoms of the trenches a layer of dielectric material; and depositing semiconductive material in the trenches to fill the trenches such that each trench filled with semiconductive material forms one of a group consisting of a drain region and a source region having a plurality of surfaces with one surface of each region being in electrical contact with the semiconductor body and with all other surfaces of the drain and source regions being dielectrically isolated from the semiconductor body.

15. A method of forming a plurality of insulated gate field effect transistors each having a gate, a source region, and a drain region with the source and drain regions being partially electrically isolated from a semiconductor body in which the transistors are formed comprising the steps of:

forming dielectric regions from a surface of the body into the body so as to define therebetween areas of the surface of the body in which transistors are to be formed;

forming in the areas in which transistors are to be formed gate regions which are separated from the surface of the body by a gate dielectric layer;

forming over a top surface of the gates a layer of silicon nitride;

etching trenches in portions of the surface of the body adjacent the gates, and then depositing thereover a layer of silicon;

etching the deposited silicon such that it is removed everywhere except in the trenches below the level of the body underneath the dielectric regions;

forming a layer of silicon nitride on all exposed silicon surfaces, said layer of silicon nitride being thinner than the layer of silicon nitride on the top surface of the gate regions;

removing the silicon nitride from all horizontal silicon surfaces while leaving the silicon nitride layer covering vertical silicon surfaces, and also leaving a portion of the silicon nitride on a top surface of the gates;

oxidizing the deposited silicon remaining in the trenches;

removing the silicon nitride on sidewalls of the trenches which are not covered by silicon oxide, leaving a portion of the silicon nitride on the top surface of the gate regions, and then depositing thereover a layer of silicon;

etching the deposited silicon such that the remaining deposited silicon is at the level of the surface of the body;

etching all remaining silicon nitride from the surface of the gate regions; and doping the gate, and source and drain regions to appropriate levels and types of conductivity.

16. A method of forming a plurality of insulated gate field effect transistors each having gate, source, and drain regions with the source and drain regions being partially electrically isolated from a semiconductor body in which the transistors are formed, and conventional insulated gate field effect transistors, said method comprising the steps of:

forming dielectric regions from the surface of the body into the body so as to define therebetween areas of the surface of the body in which transistors are to be formed;

forming in the areas in which transistors are to be formed gate regions which are separated from the surface of the body by a gate dielectric layer, a top surface of the gate regions being covered by a layer of silicon nitride;

depositing over the surface of the semiconductor body a protective layer of silicon nitride;

removing this layer from those portions of the semiconductor body where dielectrically isolated transistors are to be formed while leaving the layer in those portions of the body where conventional transistors are to be formed;

etching trenches in portions of the surface of the body adjacent to the gates, and then depositing thereover a layer of silicon;

etching the deposited silicon such that it is removed everywhere except in the trenches below the level of the body underneath the dielectric regions;

forming a layer of silicon nitride on all exposed silicon surfaces, said layer of silicon nitride being thinner than both the layer of silicon nitride on the top surface of the gate regions and the protective layer of silicon nitride;

removing the silicon nitride from all horizontal silicon surfaces while leaving the silicon nitride layer covering vertical silicon surfaces, and also leaving a portion of the silicon nitride on the surface of the gate regions and a portion of the protective layer of silicon nitride;

oxidizing the deposited silicon remaining in the trenches;

removing the silicon nitride on sidewalls of the trenches which are not covered by silicon oxide, leaving a portion of the silicon nitride on the top surface of the gate regions and a portion of the protective layer of silicon nitride, and then depositing thereover a layer of silicon;

etching the deposited silicon such that the only remaining deposited silicon is at the level of the surface of the body;

etching all remaining silicon nitride so as to remove all silicon nitride in the protective layer and from the surface of the gate regions; and doping the gate, and source and drain regions to appropriate levels and types of conductivity.

* * * * *